(12) United States Patent
Li

(10) Patent No.: US 12,376,324 B2
(45) Date of Patent: Jul. 29, 2025

(54) NON-PLANAR TWO-DIMENSIONAL ELECTRON GAS (2DEG) OR TWO-DIMENSIONAL HOLE GAS (2DHG) INCLUDING EPITAXIALLY GROWING AN N-TYPE BURIED LAYER BETWEEN FIRST CHANNEL AND SECOND CHANNEL AND A METHOD OF FORMING THE SAME

(71) Applicant: GUANGDONG ZHINENG TECHNOLOGY CO., LTD., Guangdong (CN)

(72) Inventor: Zilan Li, Guangdong (CN)

(73) Assignee: GUANGDONG ZHINENG TECHNOLOGY CO., LTD., Guangdong (CN)

( * ) Notice: Subject to any disclaimer, the term of this patent is extended or adjusted under 35 U.S.C. 154(b) by 740 days.

(21) Appl. No.: 17/594,846

(22) PCT Filed: Mar. 3, 2021

(86) PCT No.: PCT/CN2021/078960
§ 371 (c)(1),
(2) Date: Nov. 1, 2021

(87) PCT Pub. No.: WO2021/208624
PCT Pub. Date: Oct. 21, 2021

(65) Prior Publication Data
US 2022/0384633 A1  Dec. 1, 2022

(30) Foreign Application Priority Data
Apr. 13, 2020  (CN) .......................... 202010288958.0

(51) Int. Cl.
*H01L 29/778*  (2006.01)
*H01L 21/02*  (2006.01)
(Continued)

(52) U.S. Cl.
CPC ..... *H10D 30/477* (2025.01); *H01L 21/02381* (2013.01); *H01L 21/0243* (2013.01);
(Continued)

(58) Field of Classification Search
CPC ........... H01L 29/66462; H01L 29/7788; H01L 29/7789; H10D 30/477
See application file for complete search history.

(56) References Cited

U.S. PATENT DOCUMENTS 12,040,356 B2 * 7/2024 Li ......................... H10D 62/117
2011/0108885 A1 * 5/2011 Sazawa ............... H01L 29/1054
257/E21.119

(Continued)

FOREIGN PATENT DOCUMENTS

| CN | 104269433 A | 1/2015 |
| CN | 108831922 A | 11/2018 |

(Continued)

OTHER PUBLICATIONS

European Search Report for corresponding European patent application No. 21786315.8, dated Jun. 10, 2022, European Patent Office.

(Continued)

*Primary Examiner* — Anh D Mai
(74) *Attorney, Agent, or Firm* — ArentFox Schiff LLP; Yun H. Choe

(57) ABSTRACT

The present disclosure provides a non-planar hole channel transistor and a fabrication method thereof. The non-planar hole channel transistor has a substrate, and a surface of the substrate has a step structure comprising a vertical surface. A non-planar channel layer is epitaxially grown laterally with the vertical surface as a core. A barrier layer is formed on the channel layer, so as to simultaneously form a two-dimensional hole gas and/or a two-dimensional electron gas (Continued)

at an interface between the barrier layer and the channel layer.

4 Claims, 16 Drawing Sheets

(51) Int. Cl.
    *H10D 30/01*     (2025.01)
    *H10D 30/47*     (2025.01)
    *H10D 62/824*     (2025.01)
    *H10D 62/85*     (2025.01)

(52) U.S. Cl.
    CPC .... *H01L 21/0254* (2013.01); *H01L 21/02645* (2013.01); *H10D 30/015* (2025.01); *H10D 62/824* (2025.01); *H10D 62/8503* (2025.01)

(56) References Cited

U.S. PATENT DOCUMENTS

| | | | |
|---|---|---|---|
| 2013/0207078 A1 | 8/2013 | Laboutin et al. | |
| 2017/0154987 A1 | 6/2017 | Tu | |
| 2017/0222047 A1 | 8/2017 | Conway et al. | |
| 2020/0328297 A1 | 10/2020 | Li | |
| 2023/0335631 A1* | 10/2023 | Li | H10D 30/015 |
| 2024/0222490 A1* | 7/2024 | Li | H10D 30/477 |

FOREIGN PATENT DOCUMENTS

| | | |
|---|---|---|
| CN | 109524460 A | 3/2019 |
| CN | 110224019 A | 9/2019 |
| CN | 110634867 A | 12/2019 |
| CN | 111816702 A | 10/2020 |
| EP | 2765611 A2 | 8/2014 |

OTHER PUBLICATIONS

Office action dated Jun. 22, 2022 for corresponding European patent application No. 21786315.8, European Patent Office.
Office action dated Apr. 8, 2024 for corresponding European patent application No. 21786315.8, European Patent Office.
Office action dated Apr. 13, 2023 for corresponding Japanese patent application No. 2022-528141, Japanese Patent Office.
Office action dated Sep. 5, 2023 for corresponding Japanese patent application No. 2022-528141, Japanese Patent Office.
Decision to grant a patent dated Nov. 2, 2023 for corresponding Japanese patent application No. 2022-528141, Japanese Patent Office.
Office action dated Mar. 18, 2024 for corresponding Korean patent application No. 10-2022-7015501, Korean Patent Office.
International Search Report and Written Opinion for International application No. PCT/CN2021/078960, Jun. 8, 2021, ISA/CN.

* cited by examiner

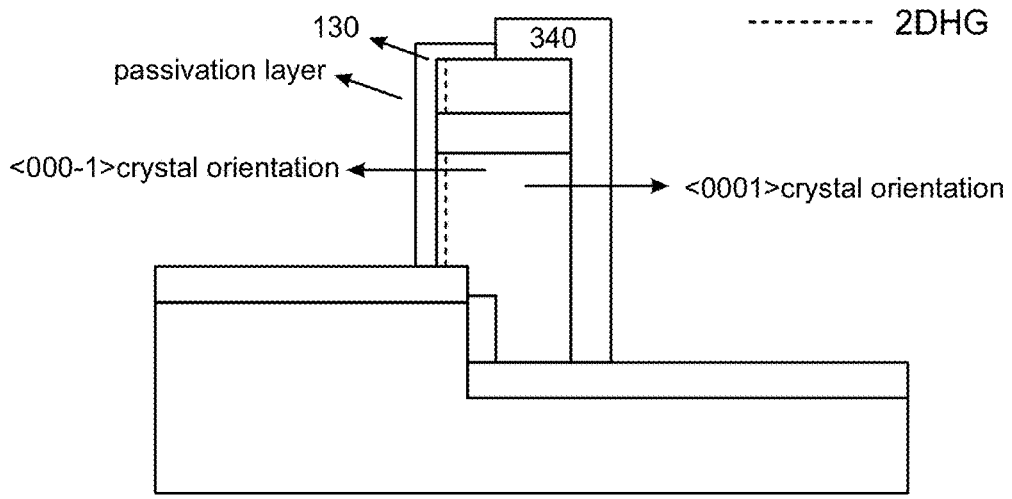

FIG. 33

```
Providing a substrate, and etching an
upper surface of the substrate to form a
step-shaped structure, wherein the
step-shaped structure has substantially
parallel first surface and second surface,
and a vertical surface connected to the
first surface and the second surface
respectively, and lattices of the vertical
surface have hexagonal symmetry
```

```
Epitaxially growing, which restricted
by the second surface, a non-planar
channel layer laterally, perpendicularly
to the second surface, with the vertical
surface as a core
```

```
Forming a barrier layer on the channel
layer, so as to simultaneously form a
two-dimensional hole gas and
immovable background negative
charges and/or a two-dimensional
electron gas and immovable
background positive charges at an
interface between the barrier layer and
the channel layer
```

FIG. 34

NON-PLANAR TWO-DIMENSIONAL ELECTRON GAS (2DEG) OR TWO-DIMENSIONAL HOLE GAS (2DHG) INCLUDING EPITAXIALLY GROWING AN N-TYPE BURIED LAYER BETWEEN FIRST CHANNEL AND SECOND CHANNEL AND A METHOD OF FORMING THE SAME

CROSS-REFERENCE TO RELATED APPLICATION

This application is a 371 U.S. national phase stage of PCT/CN2021/078960, filed Mar. 2, 2021, which claims the priority to the Chinese patent application No. 202010288958.0, Apr. 13, 2020, the contents of each of which are incorporated herein by reference in its entirety.

FIELD OF THE INVENTION

The present disclosure relates to the field of semiconductors, and more particularly, to a hole channel group III nitride semiconductor transistor, a manufacturing method, and an application thereof.

BACKGROUND OF THE INVENTION

Group III nitride semiconductors are a type of new important semiconductor materials, mainly including AlN, GaN, InN, and compounds of these materials such as AlGaN, InGaN, and AlInGaN. With the advantages of direct band gap, wide forbidden band, high breakdown electric field intensity and so on of the group III nitride semiconductor, through the optimal design of device structure and process, the group III nitride semiconductor owns great prospect in the fields of power semiconductors and radio communications. Currently, although the possibility of realizing the hole channel group III nitride transistor is explored, there is still certain difficulty in manufacturing such type of transistors up to now.

Besides, most of existing group III nitride semiconductor transistors are structurally designed as transverse devices, and do not have high enough integration level per unit area. In addition, the existing group III nitride semiconductor device transistors are normally-open devices, which is very unfavorable for energy conservation.

SUMMARY OF THE INVENTION

In view of this, the present disclosure provides a novel hole channel group III nitride transistor structure and a manufacturing method thereof, aiming at overcoming the above defects.

A brief summary of the present disclosure will be set forth below in order to provide a basic understanding of some aspects of the present disclosure. It should be understood that this summary is not an exhaustive summary of the present disclosure. It is not intended to identify the key or important parts of the present disclosure or to delineate the scope of the present disclosure. Its sole purpose is to present some concepts in a simplified form as a prelude to more detailed description that is discussed later.

According to one aspect of the present disclosure, a method of manufacturing a non-planar hole channel semiconductor transistor is provided, including:

providing a substrate, and etching an upper surface of the substrate to form a step-shaped structure, wherein the step-shaped structure has substantially parallel first surface and second surface, and a vertical surface connected to the first surface and the second surface respectively, and lattices of the vertical surface have hexagonal symmetry;

epitaxially growing, which is restricted by the second surface, a non-planar channel layer laterally, perpendicularly to the second surface, with the vertical surface as a core; and forming a barrier layer on the channel layer, so as to simultaneously form a two-dimensional hole gas and immovable background negative charges and/or the two-dimensional electron gas and immovable background positive charges at an interface between the barrier layer and the channel layer.

Optionally, the substrate is selected from $Al_2O_3$, 4H—SiC, silicon with (111) surface and silicon with (112) surface.

Optionally, the vertical surface is selected from (0001) surface of $Al_2O_3$, (0001) surface of 4H—SiC, and the (111) surface of silicon.

Optionally, a first insulating layer is formed on other surfaces of the substrate other than the vertical surface.

Optionally, a method of forming the first insulating layer includes coplanarly depositing SiN on the substrate, carrying out an etching technology having a vertical orientation with only the SiN on the vertical surface retained, then forming a silicon dioxide layer on other surfaces other than the vertical surface, further removing the SiN on a side wall by wet etching, with the silicon dioxide layer on other surfaces retained.

Optionally, forming a nucleation layer at the vertical surface is further included, wherein the nucleation layer is formed on a part of the vertical surface; or the nucleation layer is formed on the whole vertical surface.

Optionally, a polycrystalline or amorphous layer formed of a material of the nucleation layer is removed or retained on the first insulating layer.

Optionally, when the substrate is a silicon substrate, it is necessary to have the nucleation layer.

Optionally, epitaxially growing a buffer layer laterally, with the nucleation layer as a core, is further included.

Optionally, epitaxially growing a first channel layer laterally, with the nucleation layer or the buffer layer as a core, is further included.

Optionally, epitaxially growing an N-type buried layer laterally, with the first channel layer as a core, is further included.

Optionally, the buried layer can deplete 95-100% of the two-dimensional hole gas. Optionally, a body diode can be composed of the N-type buried layer and the two-dimensional hole gas.

Optionally, continuing to epitaxially grow a second channel layer laterally with the first channel layer or the buried layer as a core, is further included.

Optionally, the first channel layer and the second channel layer are of the same or different materials.

Optionally, the first channel layer is an N-type GaN, and the second channel layer is GaN, or the first channel layer is a P-type GaN, and the second channel layer is GaN.

Optionally, exposing a (0001⁻) surface of the first channel layer, or simultaneously exposing a (0001) surface and a (0001⁻) surface of the first channel layer is further included.

Optionally, removing the barrier layer covering the first channel layer in a <0001> direction is further included.

Optionally, a fourth insulating layer is formed on the first channel layer in the <0001> direction.

Optionally, when the first channel layer is a P-type GaN, the first channel layer forms a PN structure with the N-type buried layer.

Optionally, forming a third channel layer by deposition, before depositing the barrier layer, is further included.

Optionally, the third channel layer is a non-intentionally doped or intrinsic GaN, or GaN or InGaN with a lower doping concentration.

Optionally, forming a source electrode, a drain electrode, and a gate electrode of the transistor is further included.

Optionally, the source electrode and the drain electrode are in physical contact with the channel layer of the transistor, and in ohmic contact with the two-dimensional hole gas; or the source electrode and the drain electrode are in physical contact with the barrier layer, and form ohmic contact.

Optionally, the gate electrode forms Schottky contact or insulating contact with the barrier layer.

Optionally, the insulating contact refers to forming a gate insulating layer on the barrier layer in a position corresponding to the gate electrode.

Optionally, a method of forming the gate insulating layer comprises growing the gate insulating layer in an online in-situ manner after forming the barrier layer through an MOCVD method; alternatively, the gate insulating layer is separately grown in a growth apparatus different from that of the barrier layer.

Optionally, the drain, the gate, and the source are arranged in sequence in a direction substantially perpendicular to the first surface of the substrate, and positions of the source and the drain are interchangeable.

Optionally, forming a body electrode connected to the buried layer is further included.

Optionally, the body electrode is formed through physical contact with the buried layer.

Optionally, the body electrode is formed through ohmic contact with the two-dimensional electron gas, and further the body electrode is electrically connected to the buried layer through the two-dimensional electron gas.

Optionally, when the device is turned off, the body electrode depletes all or a part of the two-dimensional electron gas between the second and third electrodes, then only the background positive charges are left, thus the electric field generated by the background negative charges in the original 2DHG is partially counteracted, so that the electric field distribution is more uniform.

Optionally, the method of forming the drain further includes, by forming a first metal layer on the first surface of the substrate, removing by isotropic etching the first metal layer deposited in a small amount on the (0001⁻) surface of the barrier layer of the transistor.

Optionally, the method of forming the gate further includes forming a second insulating layer by coplanar deposition on the first metal layer, wherein the second insulating layer has a height such that the barrier layer or the gate insulating layer are exposed, then forming a second metal layer on the second insulating layer, and removing by isotropic etching the second metal layer deposited in a small amount on the (0001⁻) surface of the barrier layer of the transistor.

Optionally, the method of forming the source further includes forming a third insulating layer by coplanar deposition on the second metal layer, then forming a third metal layer on the third insulating layer, and then forming the source by lithographic etching.

According to another aspect of the present disclosure, a non-planar hole channel semiconductor transistor is provided, including:

a substrate, formed with a step-shaped structure thereon, wherein the step-shaped structure has substantially parallel first surface and second surface, and a vertical surface connected to the first surface and the second surface respectively, and lattices of the vertical surface have hexagonal symmetry;

a non-planar channel layer, which is epitaxially grown laterally, perpendicularly to the second surface and restricted by the second surface, with the vertical surface as a core; and a barrier layer formed on the channel layer, so as to simultaneously form a two-dimensional hole gas and/or a two-dimensional electron gas at an interface between the barrier layer and the channel layer.

Optionally, the substrate is selected from $Al_2O_3$, intrinsic GaN, 4H—SiC, and silicon with (111) surface and silicon with (112) surface.

Optionally, the vertical surface is selected from (0001) surface of $Al_2O_3$, (0001) surface of 4H—SiC, and the (111) surface of silicon.

Optionally, a first insulating layer is provided on other surfaces of the substrate other than the vertical surface.

Optionally, a nucleation layer is provided on the vertical surface of the substrate.

Optionally, a polycrystalline or amorphous layer formed of a material of the nucleation layer is provided on the first insulating layer.

Optionally, a buffer layer is further provided outside the nucleation layer, and the buffer layer is in a single-layer or multi-layer structure.

Optionally, a first channel layer is provided outside the nucleation layer.

Optionally, a first channel layer is provided outside the buffer layer.

Optionally, an N-type buried layer is provided on the first channel layer, and the N-type buried layer forms a body diode structure with the two-dimensional hole gas.

Optionally, a second channel layer is further provided.

Optionally, the first channel layer and the second channel layer are of the same or different materials.

Optionally, the first channel layer is an N-type GaN or a P-type GaN, and the second channel layer is GaN.

Optionally, a third channel layer is further provided, and the third channel layer is a non-intentionally doped or intrinsic GaN or InGaN, or the third channel layer is a GaN with a lower doping concentration.

Optionally, the barrier layer is not provided on the first channel layer in the <0001> direction.

Optionally, a fourth insulating layer is provided on the first channel layer in the <0001> direction.

Optionally, when the first channel layer is a P-type GaN, the first channel layer forms a body diode structure with the e buried layer.

Optionally, a source electrode, a drain electrode, and a gate electrode are further provided.

Optionally, the source electrode/the drain electrode is in physical contact with the channel layer of the transistor, and in ohmic contact with the two-dimensional hole gas; or the source electrode/the drain electrode is in physical contact with the barrier layer, forming ohmic contact.

Optionally, the gate electrode forms Schottky contact or insulating contact with the barrier layer.

Optionally, the insulating contact refers to forming a gate insulating layer between the gate electrode and the barrier layer.

Optionally, the drain, the gate, and the source are arranged in sequence in a direction substantially perpendicular to the first surface of the substrate, and positions of the source and the drain are interchangeable.

Optionally, a body electrode is further provided, and the body electrode is electrically connected to the buried layer. By providing the body electrode, the body diode constituted by the buried layer and the two-dimensional hole gas conducts a current that is reversed with respect to a direction of a current of the channel of the transistor, while stabilizing the threshold voltage; alternatively, through the connection of the body electrode, circuit application of the body diode formed by the buried layer and the first channel layer constituted by the P-type GaN is realized.

Optionally, the body electrode and the buried layer are in physical connection, or the body electrode is in ohmic contact with the two-dimensional electron gas.

Optionally, P-type doping is performed in the region of the first channel layer corresponding to the drain, and P-type doping is performed in the region of the second channel layer corresponding to the source.

According to another aspect of the present disclosure, a non-planar hole channel semiconductor device is provided, including:

a substrate, wherein a non-planar channel layer is epitaxially grown on an upper surface of the substrate in a direction perpendicular to the upper surface of the substrate, wherein the channel layer includes a first channel layer and a second channel layer; and a barrier layer (130) is formed on the channel layer, so as to simultaneously form a two-dimensional hole gas and/or a two-dimensional electron gas at an interface between the barrier layer (130) and the channel layer.

Optionally, the substrate is selected from $Al_2O_3$, intrinsic GaN, 4H—SiC, and silicon with (111) surface and silicon with (112) surface.

Optionally, a first insulating layer is provided on the upper surface of the substrate.

Optionally, a nucleation layer is provided on the substrate.

Optionally, a buffer layer is further provided outside the nucleation layer, and the buffer layer is in a single-layer or multi-layer structure.

Optionally, the first and second channel layers are parallel to the upper surface of the substrate and are stacked up and down.

Optionally, an N-type buried layer is sandwiched between the first and second channel layers.

Optionally, the N-type buried layer and the two-dimensional hole gas constitute a body diode structure.

Optionally, the first channel layer and the second channel layer are of the same or different materials.

Optionally, the first channel layer is an N- or P-type GaN, and the second channel layer is intrinsic GaN or N-type GaN.

Optionally, a third channel layer is further provided, and the third channel layer is a non-intentionally doped GaN, InGaN or AlInGaN.

Optionally, the barrier layer is not provided on the first channel layer in the <0001> direction.

Optionally, a fourth insulating layer is provided on the first channel layer in the <0001> direction.

Optionally, when the first channel layer is a P-type GaN, the first channel layer forms a body diode structure with the buried layer.

Optionally, a source, a drain, and a gate are further provided.

Optionally, the source/the drain is in physical contact with the channel layer of the transistor, and in ohmic contact with the two-dimensional hole gas; or the source/the drain is in physical contact with the barrier layer, forming ohmic contact.

Optionally, the gate forms Schottky contact or insulating contact with the barrier layer.

Optionally, the insulating contact refers to forming a gate dielectric layer between the gate and the barrier layer.

Optionally, the source electrode, the gate electrode, and the drain electrode are arranged in sequence in a direction substantially perpendicular to the upper surface of the substrate; and positions of the source electrode and the drain electrode are interchangeable.

Optionally, a body electrode is further provided, and the body electrode is electrically connected to the buried layer.

Optionally, the body electrode and the buried layer are in physical connection, or the body electrode is in ohmic contact through the two-dimensional electron gas.

According to another aspect of the present disclosure, a radio frequency device is provided, including the transistor as described in the preceding.

According to another aspect of the present disclosure, an electric power device is provided, including the transistor as described in the preceding.

BRIEF DESCRIPTION OF THE DRAWINGS

Specific contents of the present disclosure are described in the following with reference to the accompanying drawings, which will help to more easily understand the objectives, features, and advantages of the present disclosure. The accompanying drawings are only to illustrate the principle of the present disclosure. In the accompanying drawings, it is unnecessary to draw the size and relative positions of the units according to scale. In the accompanying drawings:

FIGS. 32-33 are schematic diagrams of an optional hole channel group III nitride transistor structure and a manufacturing method thereof; and FIG. 34 is a schematic diagram of an optional hole channel group III nitride transistor manufacturing method.

DETAILED DESCRIPTION OF THE INVENTION

Exemplary disclosure disclosed in the present disclosure will be described below in conjunction with the accompanying drawings. For the sake of clarity and conciseness, not all features realizing the present disclosure are described in the description. However, it should be understood that many modes that can implement the present disclosure may be made in the course of realizing the present disclosure so as to achieve the developer's specific objectives, and these modes may vary with differences of the present disclosure.

It is also to be noted herein that in order to avoid complicating the present disclosure with unnecessary details, only device structures closely related to the solution according to the present disclosure are shown in the accompanying drawings, and some details are omitted.

It should be understood that the contents in the present disclosure will not be merely limited to the embodiments described although the following descriptions are made with reference to the accompanying drawings. In the present disclosure, features among different embodiments may be substituted or combined, or one or more features may be omitted in one embodiment, where feasible.

The accompanying drawings may be referred to in the following specific embodiments, and the accompanying drawings show a part of the present disclosure and illustrate exemplary embodiments. In addition, it should be understood that other embodiments may be utilized to make structural and/or logical changes without departing from the scope of the claimed subject matter. It should also be pointed out that the directions and positions (for example, up, down, top, and bottom, etc.) are only used to help describing the features in the accompanying drawings, while it is not intended to merely adopt the following specific embodiments in a restrictive sense.

As used in the specification and appended claims of the present disclosure, unless otherwise indicated clearly in the context, terms "a (an)", "one", and "the" also include plural forms. It will also be understood that the term "and/or" as used herein refers to and includes any and all possible combinations of one or more of the associated listed items.

Group III nitride semiconductors mainly have two crystal structures of wurtzite and zinc-blende. As wurtzite has the advantages of being stable and easily obtaining higher crystal quality, the group III nitride semiconductors practically applied usually have the wurtzite structure.

Therefore, specifically, the group III nitride transistor structure in the present disclosure includes a group III nitride transistor using a wurtzite crystal structure. Optionally, the group III nitride transistor is a hole channel group III nitride transistor; optionally, the hole channel group III nitride transistor is a normally-closed hole channel nitride transistor; and more optionally, the normally-closed hole channel nitride transistor is a normally-closed hole channel gallium nitride transistor.

Figure 1:
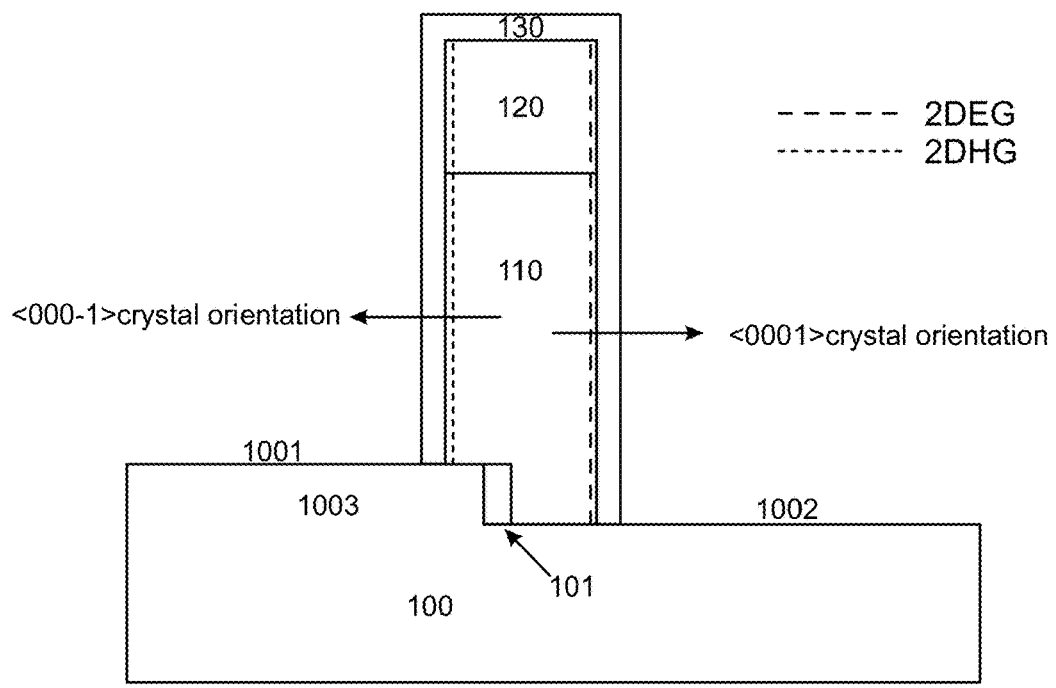
FIGS. 1-12 are schematic diagrams of a hole channel group III nitride transistor structure and a manufacturing method thereof.
Figure 2:
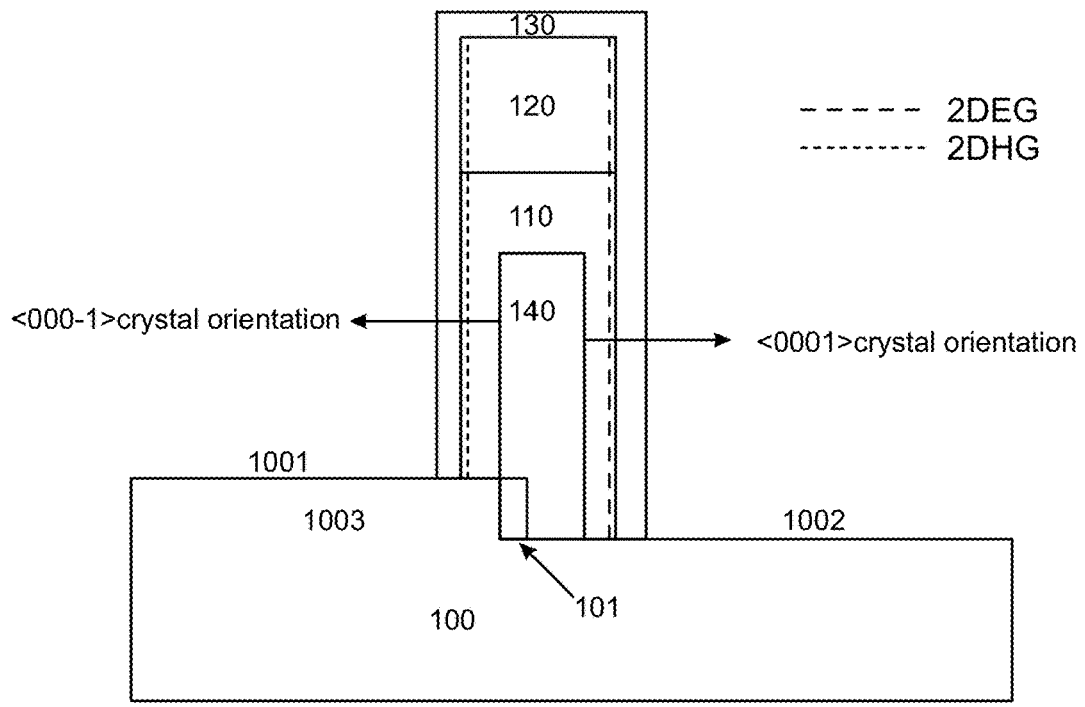
Figure 3:
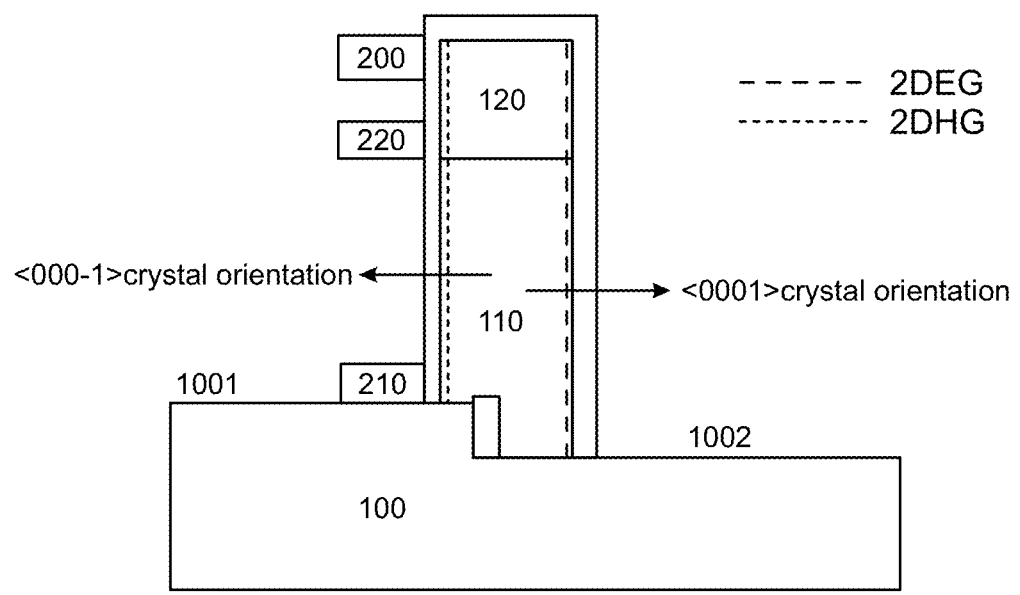

As shown in FIGS. 1-3, the group III nitride transistor includes a substrate 100. In the nitride transistor, an independent substrate or a bulk GaN material may be adopted. As the GaN material is quite expensive to prepare, a feasible way is to epitaxially grow GaN on a heterogeneous substrate and fabricate a device. Heterogeneous substrate materials mainly include $Al_2O_3$ (sapphire), silicon, and SiC etc. In the above, the (0001) surface of $Al_2O_3$, the (0001) surface of 4H—SiC, the (111) surface of silicon and so on, all having a hexagonal symmetrical lattice structure, are suitable as a substrate surface for heterogeneous growth, and the nitride semiconductor is nucleated and grown thereon, which is favorable for obtaining GaN or AlN crystals of higher quality.

In addition, as the cost of the sapphire substrate is low and the lattices between the gallium nitride epitaxial layer and the sapphire substrate are relatively matched, a large amount of sapphire has been used. If the heat dissipation property is taken into consideration, more and more silicon substrates are also used to prepare the GaN epitaxial layer, but the problems of leakage current and withstand voltage need to be taken into consideration when the silicon substrate is adopted. In the process flow of the present disclosure, elaborate design is made thereto, which can avoid the influence of silicon substrate material on the performance of a device, and obviously helps to increase the withstand voltage and reduce the dark current.

To sum up, the material of the heterogeneous substrate may be selected according to actual needs, and the present disclosure does not limit the specific material of the substrate, as long as the substrate material can satisfy that a side surface of a vertical trench formed on and perpendicular to a surface of the substrate has a hexagonal symmetrical lattice structure. In the present disclosure, the substrate material may be $Al_2O_3$ (sapphire), 4H—SiC, silicon, intrinsic GaN, and the like.

In the present disclosure, as shown in FIG. 1, a step-shaped structure is formed on the substrate 100 by photolithographic etching, and the step-shaped structure is constituted by a first surface 1001 of the substrate 100, a second surface 1002 parallel to the first surface, and a vertical surface 1003 connected to the first surface 1001 and the second surface 1002 respectively. The vertical surface has hexagonal symmetry. Exemplarily, the step shape has a stepped depth of about 5 micrometers.

A nucleation layer 101 is formed on the vertical surface, and the nucleation layer 101 may be formed on a part of the vertical surface or on the whole vertical surface. For a silicon material, due to the influence of melt-back effect of Ga atoms, a semiconductor layer such as GaN cannot be directly grown on the substrate, and a structure such as an AlN or GaN nucleation layer is usually required to be grown on the substrate so that the GaN epitaxial layer may be further grown. However, the GaN can be directly nucleated and grown on $Al_2O_3$ (sapphire), SiC, or intrinsic GaN, but if it goes from the perspective of crystal control quality, the nucleation layer 101 may be introduced during the process.

With the nucleation layer 101 as a core, a first channel layer 110 is epitaxially grown laterally upwards, perpendicularly to the second surface, and restricted by the second surface 1002 of the substrate 100, and then a second channel layer 120 continues to be epitaxially grown laterally. The first channel layer 110 and the second channel layer 120 may be of the same or different materials. Exemplarily, the first channel layer is an N-type doped GaN layer, and the second channel layer is a GaN layer, or the first channel layer is a P-type doped GaN layer, and the second channel layer is a GaN layer, with the doping concentration of 1E17-1E20/$cm^3$. It may be understood that the substrate may not be etched into the step shape, for example, nucleation and growth may be performed directly on an upper surface of the substrate so as to form the first channel layer and the second channel layer.

Optionally, as shown in FIG. 2, a buffer layer 140 further may be provided between the nucleation layer and the first channel layer. The buffer layer 140 may be in a single-layer or multi-layer structure. The material of the buffer layer may be, for example, one or more of AlN, GaN, AlGaN, InGaN, AlInN, and AlGaInN.

Optionally, corresponding P-type doping is performed in a part of the second channel layer 120 corresponding to a partial region where a source electrode of the transistor is subsequently formed, and the P-type doping may also be performed in a part of the first channel layer 110 corresponding to a partial region where a drain electrode of the transistor is formed. The P-type doping may effectively reduce the contact resistance of a corresponding region. The P-type doping concentration may be 1E17-1E20/cm³.

The second channel layer 120 covering two sides of the first channel layer in a direction of the first surface is removed, to expose the first channel layer. A barrier layer 130, such as AlGaN, is formed on the first channel layer and the second channel layer.

As the channel layers and the barrier layer adopt the group III nitride semiconductor, with the group III nitride semiconductor having polarity, fixed polarization charges may be present on the surface of the polar semiconductor or at an interface of two different polar semiconductors. The presence of these fixed polarization charges may attract movable holes and electrons so as to form a two-dimensional hole gas 2DHG and a two-dimensional electron gas 2DEG. The generation of these two-dimensional hole gas 2DHG and two-dimensional electron gas 2DEG neither requires an additional electric field, nor relies on the doping effect in the semiconductor, and they are spontaneously generated. As doping is not required, the ion scattering effect on the two-dimensional hole gas is greatly reduced, therefore, a higher mobility is rendered.

After the barrier layer is formed, the 2DHG is formed in the first and second channel layers at an interface with the barrier layer in a <0001⁻> direction. Alternatively, the second channel layer 120 covering the first channel layer in the <0001⁻> direction and a <0001> direction, to expose the first channel layer. The barrier layer 130, such as AlGaN, is formed on the first channel layer and the second channel layer. Thus, the 2DHG is formed in the first and second channel layers at the interface with the barrier layer in the <0001⁻> direction, and meanwhile, the 2DEG is formed in the first and second channel layers at the interface with the barrier layer in the <0001> direction.

A source electrode 200, a drain electrode 210, and a gate electrode 220 of the transistor are formed. Positions of the source electrode 200, the drain electrode 210, and the gate electrode 220 are not specifically limited. The source electrode and the drain electrode may be in physical contact with the channel layer (110/120) of the transistor, and in ohmic contact with the two-dimensional hole carrier gas (2DHG), or the source electrode and the drain electrode are directly in physical contact with the barrier layer 130. In addition, the gate electrode 220 can form, on the barrier layer 130, insulating contact or Schottky contact with the barrier layer 130, wherein the insulating contact refers to forming a gate insulating layer 300 between the gate electrode and the barrier layer. The gate insulating layer may be of silicon dioxide, a high-K dielectric material, or the like. The gate insulating layer 300 may serve a function of passivating the surface of the barrier layer, which is beneficial to reducing a gate leakage current of the transistor and using the transistor as a power electronic device.

When the gate is directly fabricated on the barrier layer, it has a larger gate leakage current, in which case the barrier layer, when maintaining a high enough forbidden bandwidth, also plays a role of a dielectric layer. The transistor fabricated in this way is mostly used as a radio frequency (RF) device.

Exemplarily, as shown in FIG. 3, the source electrode 200, the drain electrode 210, and the gate electrode 220 may be aligned in a direction perpendicular to the first surface of the substrate 100. In the above, the drain electrode 210 is closer to the first surface 1001 of the substrate 100. It will be understood that the source electrode may be also closer to the first surface 1001 of the substrate 100.

A method of manufacturing a semiconductor device in this structure is now described in detail with reference to FIGS. 4-12 and FIG. 34.

Figure 4:
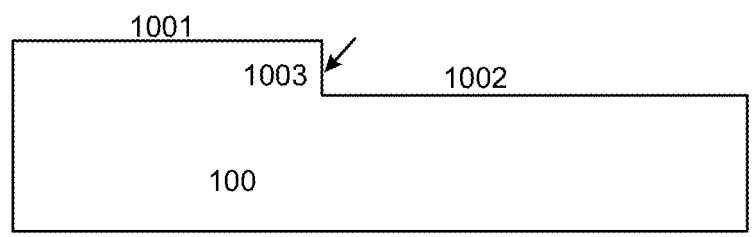

In Step 1, as shown in FIG. 4, a substrate 100 is provided, a lithographic pattern is formed on the substrate 100, and then a step-shaped structure is formed by etching an upper surface of the substrate. Exemplarily, an etching depth is about 5 μm. The step-shaped structure is constituted by a first surface 1001 of the substrate 100, a second surface 1002 parallel to the first surface 1001, and a vertical surface 1003 connected to the first surface 1001 and the second surface 1002 respectively, wherein the vertical surface has a hexagonal symmetrical lattice structure. The vertical surface having the hexagonal symmetrical lattice structure is easy for nucleation and growth of a nitride semiconductor, while other surfaces are not easy for the nucleation and growth of the nitride semiconductor.

Figure 5:
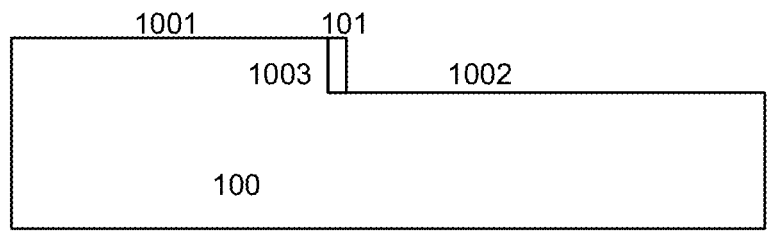

In Step 2, as shown in FIG. 5, a nucleation layer 101 is formed on the vertical surface, and the nucleation layer 101 may be formed on a part of the vertical surface or on the whole vertical surface. A material of the nucleation layer is, exemplarily, for example, GaN or ALN.

For a silicon material, due to the influence of melt-back effect of Ga atoms, GaN cannot be directly grown on the substrate, and a structure such as a nucleation layer is usually required to be grown on the substrate for further growth of the GaN epitaxial layer.

Figure 6:
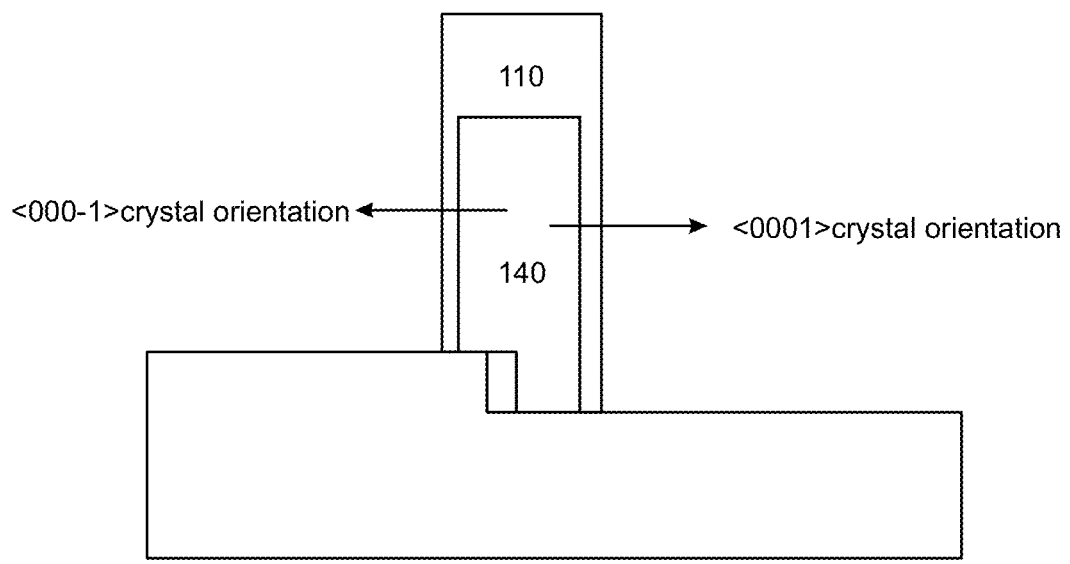
Figure 7:
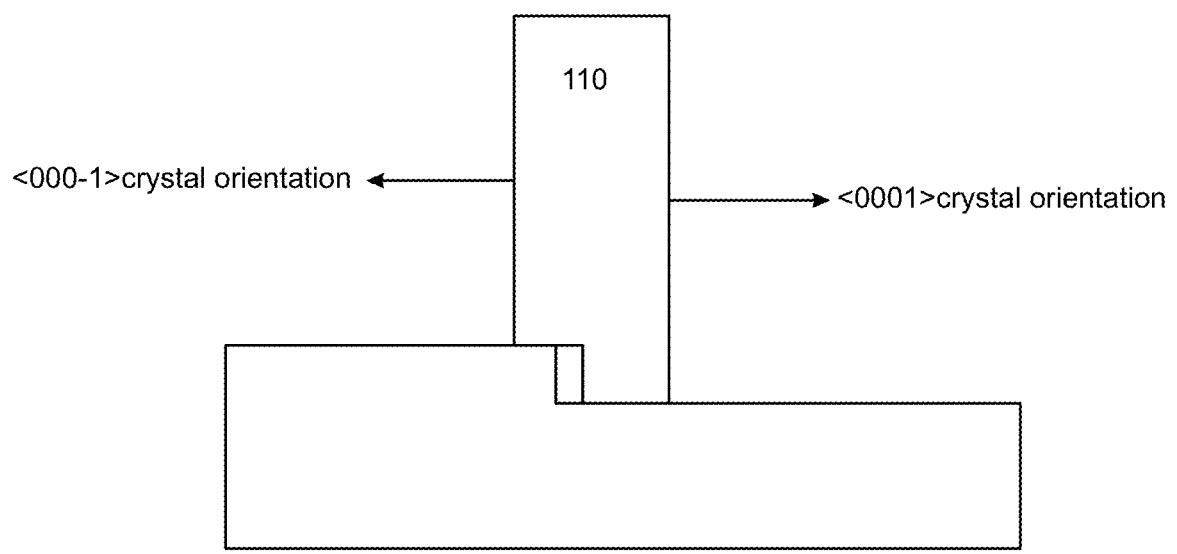

In Step 3, as shown in FIG. 6, with the nucleation layer 101 as a core, and restricted by the second surface 1002 of the substrate 100, a buffer layer 140 is epitaxially grown upwards along the vertical surface of the substrate and laterally along the second surface of the substrate, and then a first channel layer 110 is epitaxially grown laterally. It may be understood that the buffer layer is not essential, and thus it is also feasible, as shown in FIG. 7, that the first channel layer 110 is epitaxially grown laterally with the nucleation layer as a core.

Figure 8:
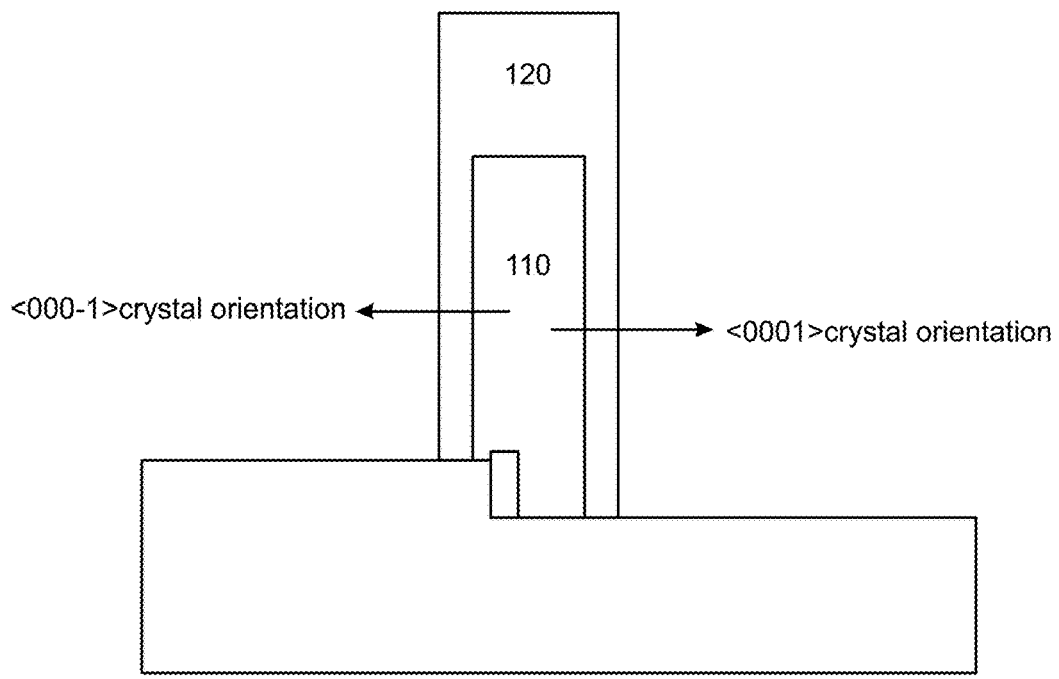

In Step 4: as shown in FIG. 8, with the first channel layer 110 as a core, a second channel layer 120 continues to be epitaxially grown laterally. The first channel layer 110 and the second channel layer 120 may be of the same or different materials. For example, N-type doping or P-type doping may be performed in the process of epitaxially growing the first channel layer laterally. It may be understood that taking subsequently forming a drain at the first channel layer as an example herein, if a source is subsequently formed at the first channel layer, the N-type doping or the P-type doping is performed in the process of epitaxially growing the second channel layer laterally.

Optionally, corresponding P-type doping is performed in the part of the second channel layer 120 corresponding to a partial region where a source electrode of the transistor is subsequently formed, and the P-type doping may also be performed in the part of the first channel layer 110 corresponding to a region where a drain electrode of the transistor is formed. The P-type doping may effectively reduce the contact resistance of the corresponding region.

Figure 9:
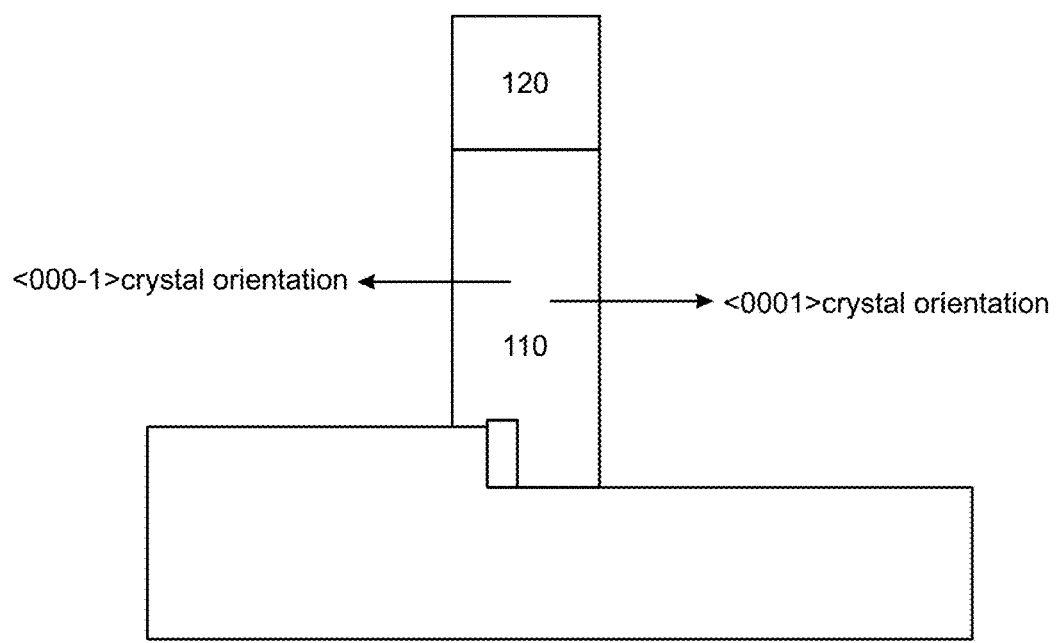
Figure 10:
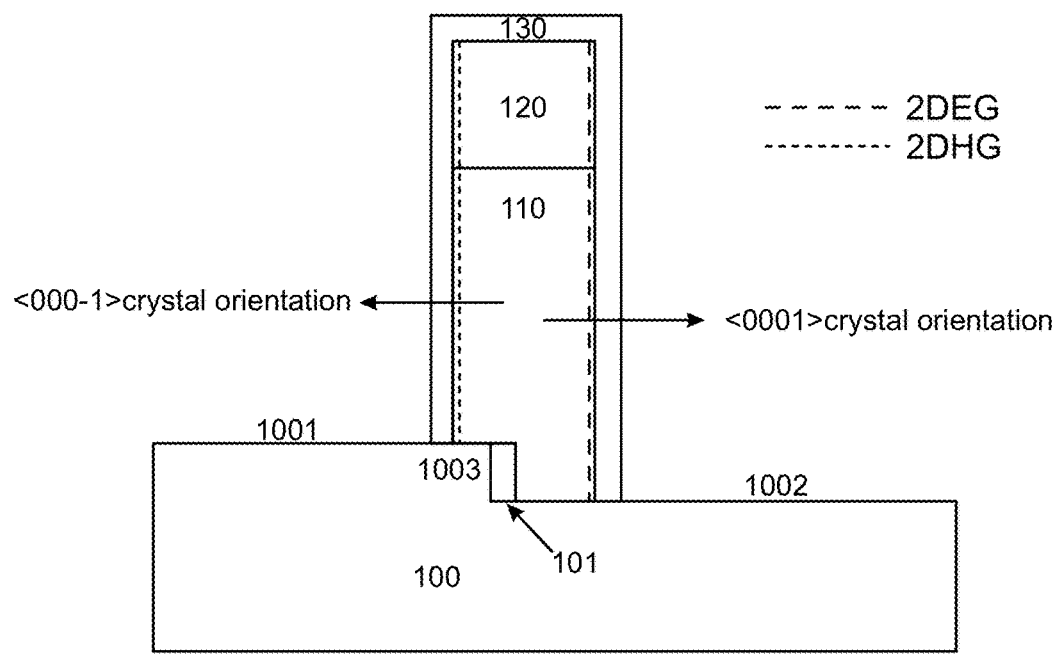

In Step 5, as shown in FIG. 9, the second channel layer 120 covering the first channel layer in the <0001⁻> direction is removed, to expose the (0001⁻) surface of the first channel layer, meanwhile, the second channel layer 120 covering the first channel layer in the <0001> direction is removed, to expose the (0001) surface of the first channel layer. Then as shown in FIG. 10, the barrier layer 130, such as AlGaN, is formed on the first channel layer and the second channel layer. Thus, 2DHG and immovable background negative charges are formed in the first and second channel layers at an interface with the barrier layer in the <0001⁻> direction; and 2DEG and immovable background positive charges are formed in the first and second channel layers at an interface with the barrier layer in the <0001> direction.

Figure 11:
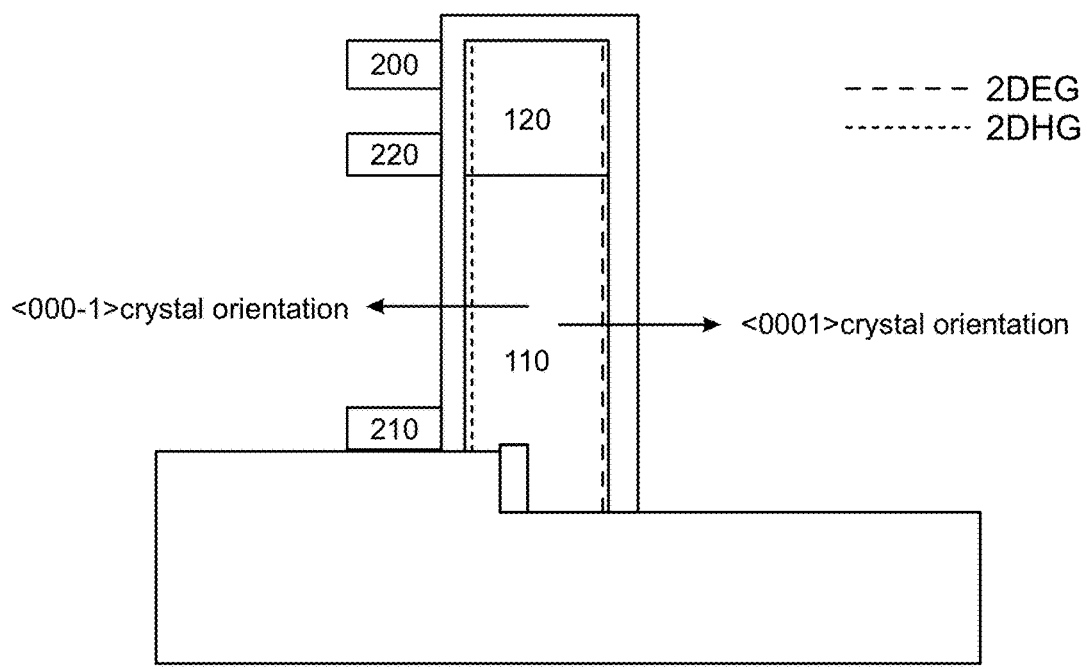

In Step 6, as shown in FIG. 11, a source electrode 200, a drain electrode 210, and a gate electrode 220 of the transistor are formed. Positions of the source electrode 200, the drain electrode 210, and the gate electrode 220 are not specifically limited. The source electrode and the drain electrode may be in physical contact with the channel layer (110/120) of the transistor, and in ohmic contact with the two-dimensional hole carrier gas (2DHG), or the source electrode and the drain electrode are directly in physical contact with the barrier layer 130. In addition, the gate electrode 220 can form, on the barrier layer 130, insulating contact or Schottky contact with the barrier layer 130.

Figure 12:
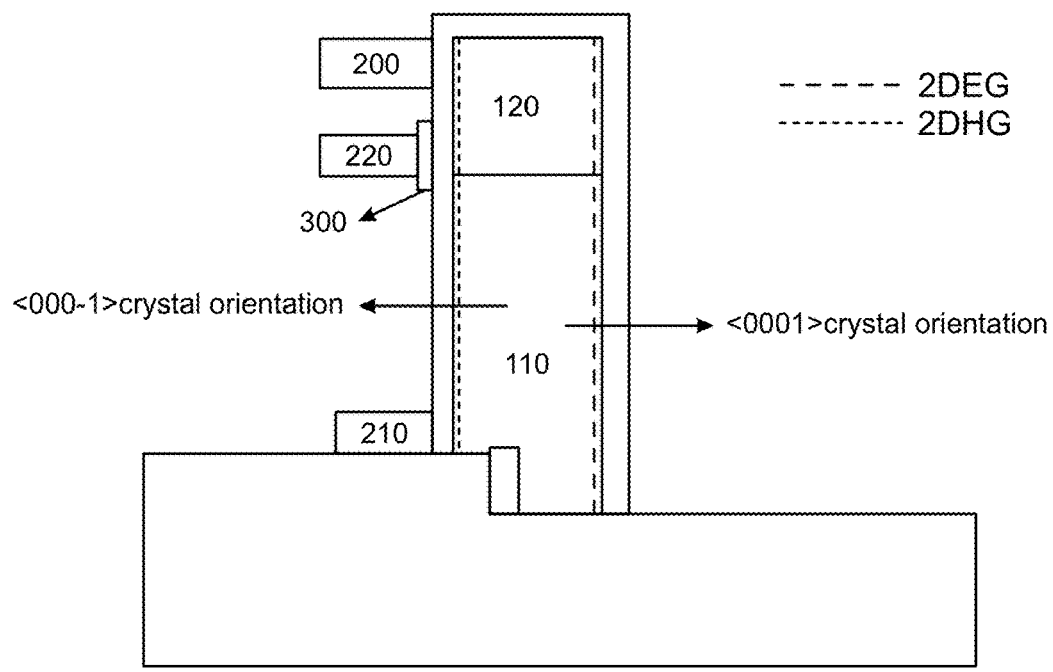

As shown in FIG. 12, the insulating contact refers to forming a gate insulating layer 300 between the gate electrode and the barrier layer, and a method of forming the gate insulating layer 300 may be online in-situ growth after forming the barrier layer in an MOCVD chamber. The method of forming the gate insulating layer 300 also may be separate growth in a growth apparatus different from that of the barrier layer. However, it should be indicated that the quality of the gate insulating layer obtained by the online in-situ growth is better, therefore, the online in-situ growth is preferred for growing the insulating layer.

The gate insulating layer may be of silicon dioxide, SiN, a high-K dielectric material, or the like. The gate insulating layer 300 may serve a function of passivating the surface of the barrier layer, which is beneficial to reducing a gate leakage current of the transistor and application of the transistor in the aspect of power electronics. If the gate electrode is directly fabricated on the barrier layer, the transistor thus fabricated is more applied in the radio frequency (RF) device because it has a larger gate leakage current with respect to the transistor having the gate insulating layer.

Exemplarily, the source electrode 200, the drain electrode 210, and the gate electrode 220 may be aligned in a direction perpendicular to the first surface of the substrate 100. In the above, the drain electrode 210 is closer to the first surface 1001 of the substrate 100. The gate electrode 220 is located between the drain electrode 210 and the source electrode 200.

Optionally, when the P-type doping exists in the source region and the drain region in the first and second channel layers, the source electrode and the drain electrode are in physical contact with the channel layers of the transistor, which is favorable for reducing the ohmic contact resistance.

Thus, with the non-planar group III nitride transistor having an irregular cross section grown on the vertical surface, the integration level of the device may be improved, the gate leakage current can be effectively reduced, and the preparation process is simple. Through lateral epitaxy on the vertical surface, the two-dimensional electron carrier gas may be formed while the two-dimensional hole carrier gas is formed, effectively improving the mobility of holes.

Figure 13:
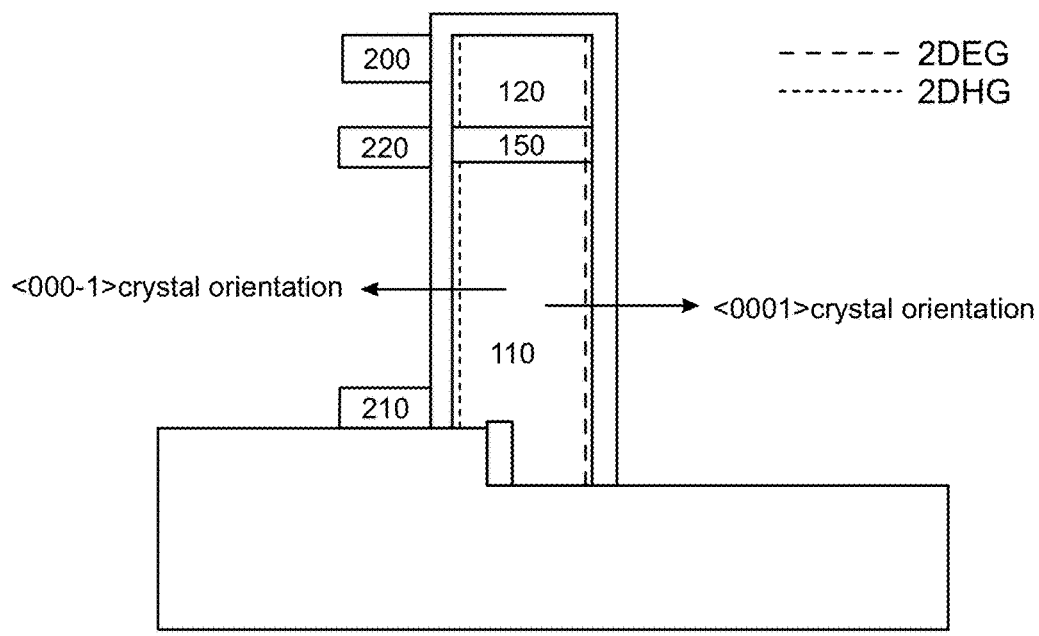
FIGS. 13-15 are schematic diagrams of an optional hole channel group III nitride transistor structure and a manufacturing method thereof.

As shown in FIG. 13, there is also an N-type buried layer between the first channel layer and the second channel layer.

Figure 14:
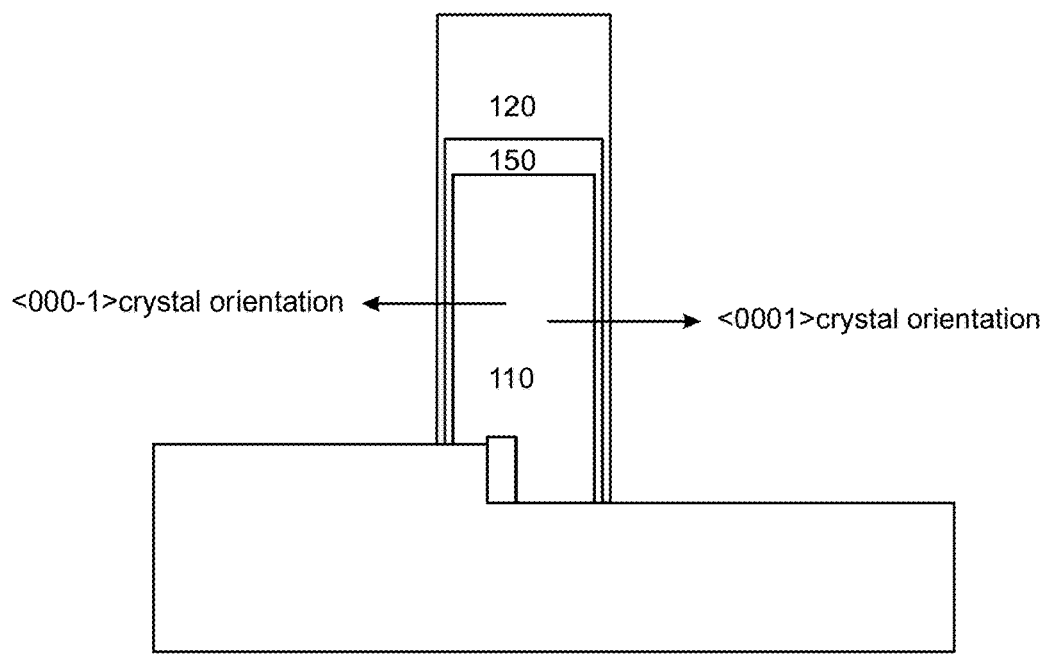

A specific manufacturing method thereof is as shown in FIG. 14. In Step 4, after the first channel layer 110 is epitaxially grown laterally, with an AlN nucleation layer as a core and restricted by the second surface 1002 of the substrate 100, and before the second channel layer 120 is epitaxially grown laterally, the N-type buried layer of formed by performing lateral epitaxial growth first, wherein the N-type buried layer is exemplarily an N-type GaN layer. Then with the buried layer as a core, the second channel layer 120 continues to be epitaxially grown laterally. The doping concentration of the covered N-type buried layer is exemplarily $1E17$-$5E19/cm^3$, more preferably $1E+18/cm^3$-$5E+19/cm^3$. The N-type GaN layer may deplete the two-dimensional hole gas in the channel layers, further causing the device to have a normally-closed state. It may be understood that the doping may be gradual, which will not be described herein. Optionally, projection of the N-type buried layer in the <0001⁻> direction falls within a projection range of the gate electrode in this direction, or partially overlaps the projection of the gate electrode in this direction. Settings of the N-type buried layer, such as doping concentration and dimensional parameter thereof, may be set according to parameters of the device as long as 95%-100% of the two-dimensional hole gas above can be depleted. The higher the concentration of the two-dimensional hole gas is, the corresponding doping concentration may be increased accordingly.

Figure 15:
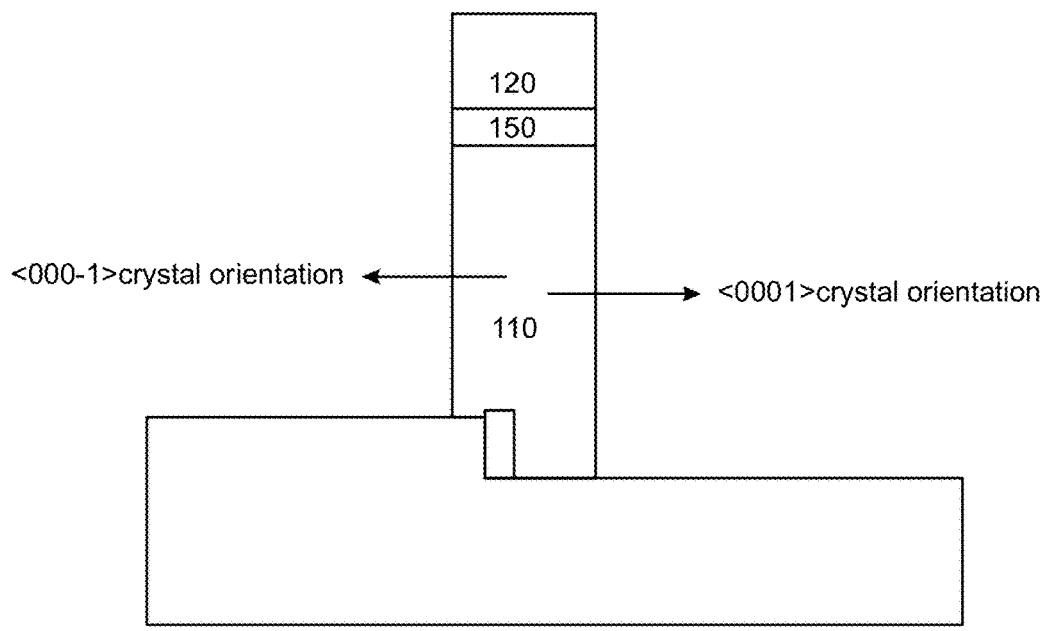

Then as shown in FIG. 15, the buried layer and the second channel layer 120 covering the first channel layer in the <0001⁻> direction are removed, to expose the (0001⁻) surface of the first channel layer, meanwhile, the buried layer and the second channel layer 120 covering the first channel layer in the <0001> direction are removed, to expose the (0001) surface of the first channel layer.

It may be understood that the structure of a body diode is also realized while forming the N-type GaN layer and the 2DHG channel.

The N-type GaN layer, in the case of causing that the device may have a normally-closed state, meanwhile also forms a PN structure with the 2DHG, in which the 2DHG constitutes "P" part in the PN structure. The PN structure is integrally manufactured in the transistor structure. Such PN structure may be used for various circuit applications through the connection of subsequent electrodes, enriching the design and function of the circuit. Exemplarily, in circuit applications, the PN structure may conduct a current reversed with respect to a current direction of an HHMT.

Figure 16:
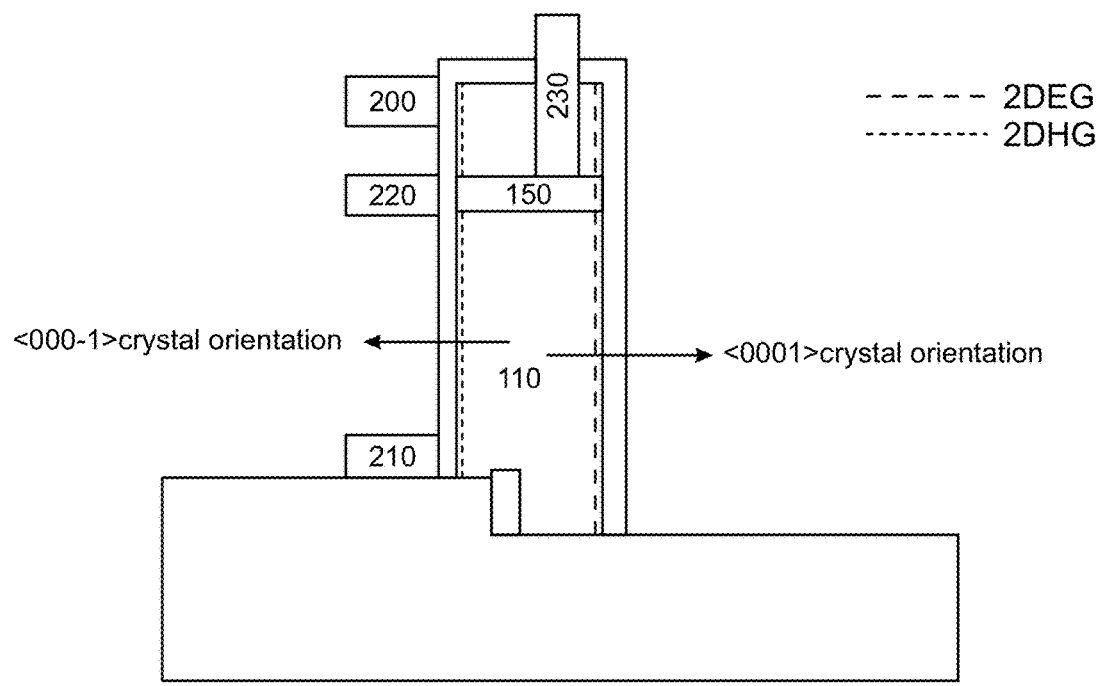
FIGS. 16-17 are schematic diagrams of an optional hole channel group III nitride transistor structure and a manufacturing method thereof.

Optionally, a body electrode 230 is further provided, and the body electrode is connected to the N-type buried layer. Exemplarily, as shown in FIG. 16, the body electrode 230 may be formed by etching non-polar or semi-polar surfaces of the barrier layer and the second channel layer to obtain a through hole reaching the N-type buried layer, and then further filling a metal.

Figure 17:
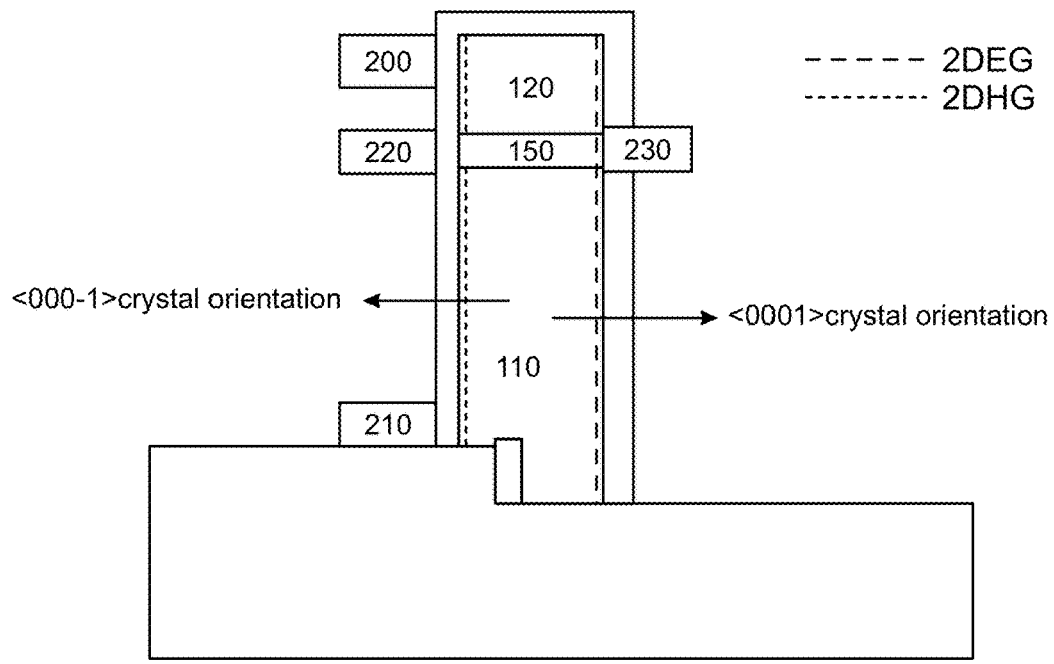

It may be understood that as shown in FIG. 17, a method of forming the body electrode may also comprises completely removing or partially removing the barrier layer covering the first channel layer in the <0001> direction to expose the N-type buried layer, and further forming the body electrode 230 on the exposed N-type buried layer.

It should be noted that when the body electrode 230 is not present, the potential of the N-type semiconductor buried layer is floating, which is not conducive to stably controlling a threshold voltage of the device.

Besides, the PN structure is formed between the N-type buried layer and the first channel layer formed by the P-type GaN, and the PN structure can be provided to be connected in parallel at two ends of the transistor through the voltages of the drain electrode and the body electrode. In circuit applications, the PN structure may conduct a current reversed with respect to the current direction of the HHMT, enriching the design and function of the circuit.

Figure 18:
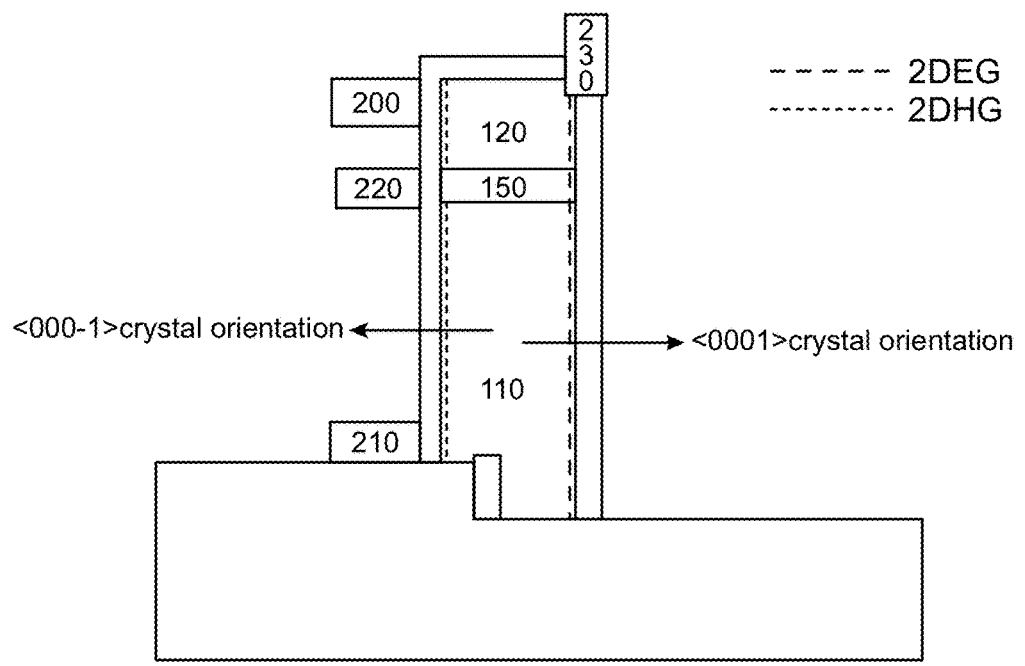
FIG. 18 is a schematic diagram of an optional hole channel group III nitride transistor structure and a manufacturing method thereof.

Optionally, as shown in FIG. 18, a body electrode 230 is further provided, and the body electrode 230 is in contact with the two-dimensional electron gas. It may be understood that the body electrode 230 only needs to be in contact with the two-dimensional electron gas, while a specific position thereof is not further limited. Exemplarily, by etching the barrier layer on the (0001) surface, the second channel layer on the (0001) surface is exposed, so that the body electrode 230 is formed on the second channel layer. Due to the spontaneous effect and the piezoelectric effect, the two-dimensional electron gas (2DEG) is formed in the first and second channel layers at the interface with the barrier layer in the <0001> direction. Thus, the body electrode is electrically connected through the two-dimensional electron gas to the N-type nitride semiconductor buried layer and controls the potential thereof.

It should be indicated that when the body electrode 230 is not present, the potential of the N-type semiconductor buried layer is floating, which is not conducive to stably controlling the threshold voltage of the control device, and in this case, with the two-dimensional electron gas spontaneously formed in the channel layer and the indirect electrical connection between the two-dimensional electron gas and the N-type semiconductor buried layer, the potential of the N-type buried layer is controlled, and further the setting of the body electrode is also made more flexible. Optionally, the above PN structure may also be applied to the circuit through such a connection manner between the body electrode and the two-dimensional electron gas, so that the PN structure may conduct a current reversed with respect to the current direction of the HHMT, enriching the design and function of the circuit.

Since there are also immovable background positive charges in the channel layer when the two-dimensional electron gas is spontaneously formed, the background positive charges attract the two-dimensional electron gas. When the device is turned off, as the drain electrode is at a negative high voltage, the body electrode depletes the 2DHG, the background negative charges are left, and due to the electric field effect, the connection between the body electrode and the 2DEG will also deplete all or part of the 2DEG located between the gate and the drain and expose the background positive charges. The background positive charges may partially counteract the distribution of the electric field generated by the background negative charge and increase the withstand voltage of the device.

Figure 19:
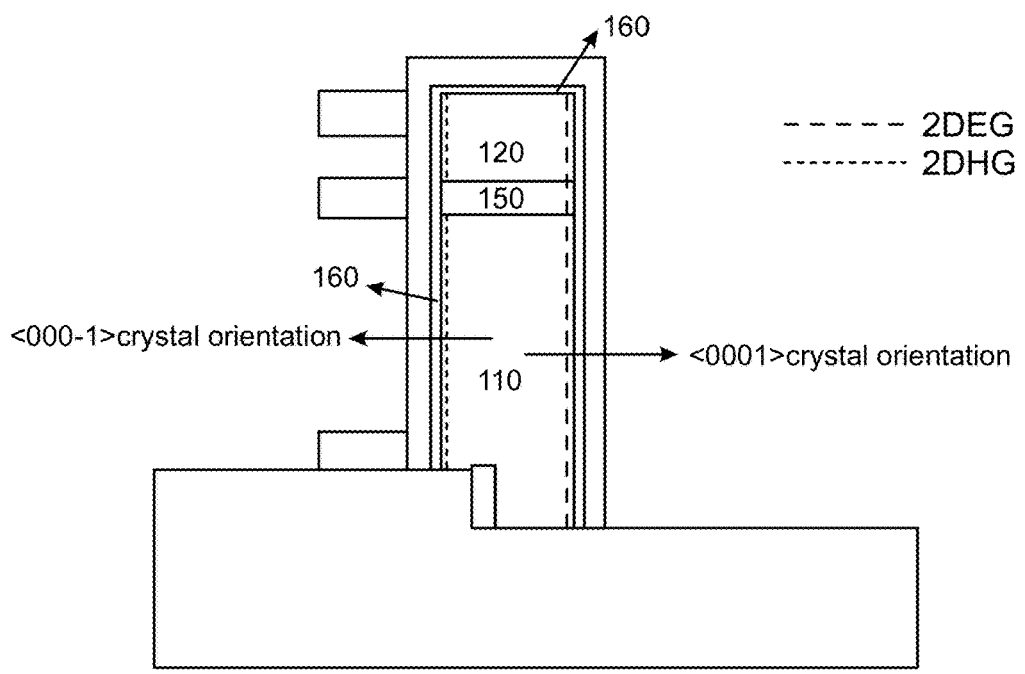
FIGS. 19-21 are schematic diagrams of an optional hole channel group III nitride transistor structure and a manufacturing method thereof.
Figure 20:
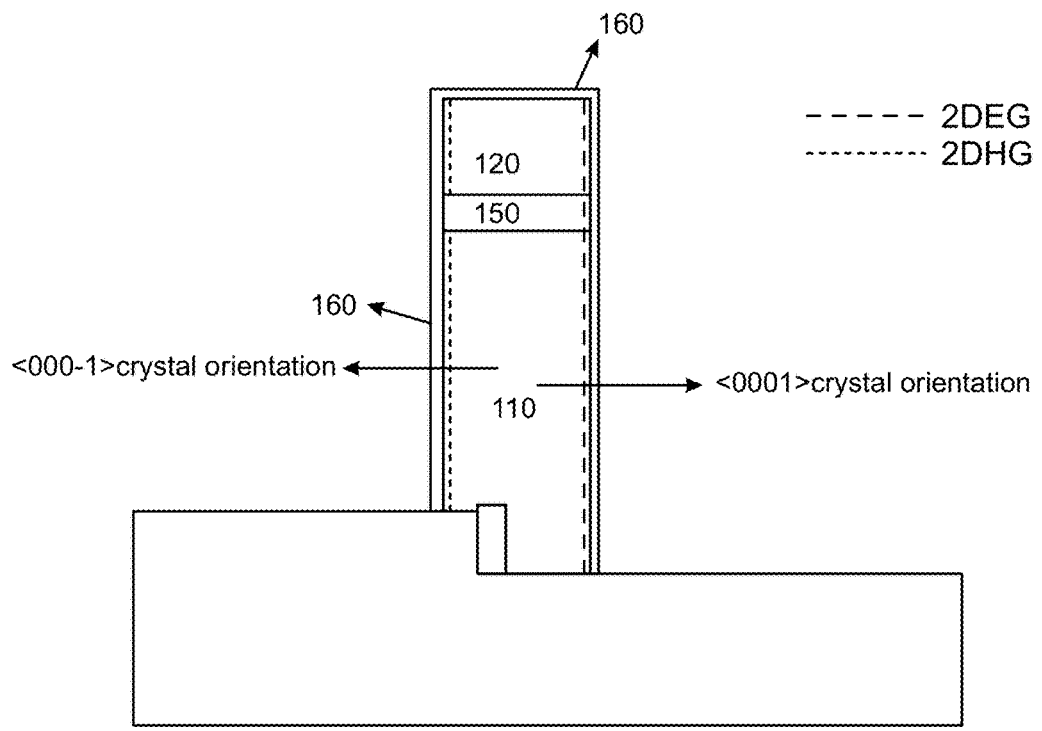
Figure 21:
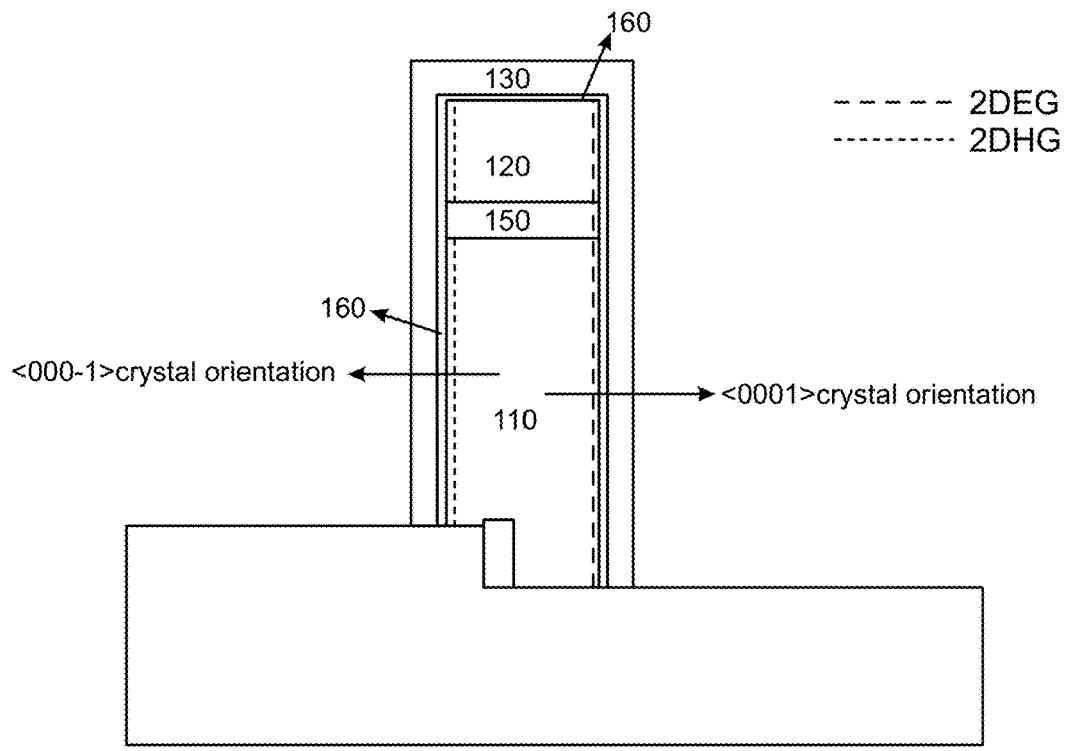

Optionally, as shown in FIGS. 19-21, before forming the barrier layer on the first channel layer, the buried layer, and the second channel layer, a third channel layer 160 is further formed. As shown in the drawings, a fabricating method thereof may comprise: before forming the barrier layer by deposition in the above step 5, first forming a third channel layer 160 by deposition. The third channel layer 160 may be non-intentionally doped or intrinsic GaN. It may be understood that the third channel layer may also be GaN with a lower doping concentration, and exemplarily, the doping concentration is less than $1E18/cm^3$. The lower doping concentration may effectively reduce scattering of doping atoms or ions on channel carriers while maintaining good closing of the channel. Alternatively, the third channel layer also may be InGaN.

While the buried layer 150 depletes 95-100% of the 2DHG at the corresponding channel, due to the effect of ion scattering or the like, the resistance of the transistor, when being turned on, will be greatly increased. The arrangement of the third channel layer may significantly reduce the ion scattering effect brought about by the N-type semiconductor buried layer, thus on-resistance of the transistor may be reduced. In addition, the decrease in electron mobility caused by ion scattering may be reduced by providing the third channel layer. Besides, a larger difference in forbidden bandwidth between the first and second channel layers and the barrier layer may be obtained by adopting a material with a lower forbidden bandwidth for the first and second channel layers. In addition, the third channel layer is formed before the barrier layer is grown, which has small change to the process flow.

Figure 22:
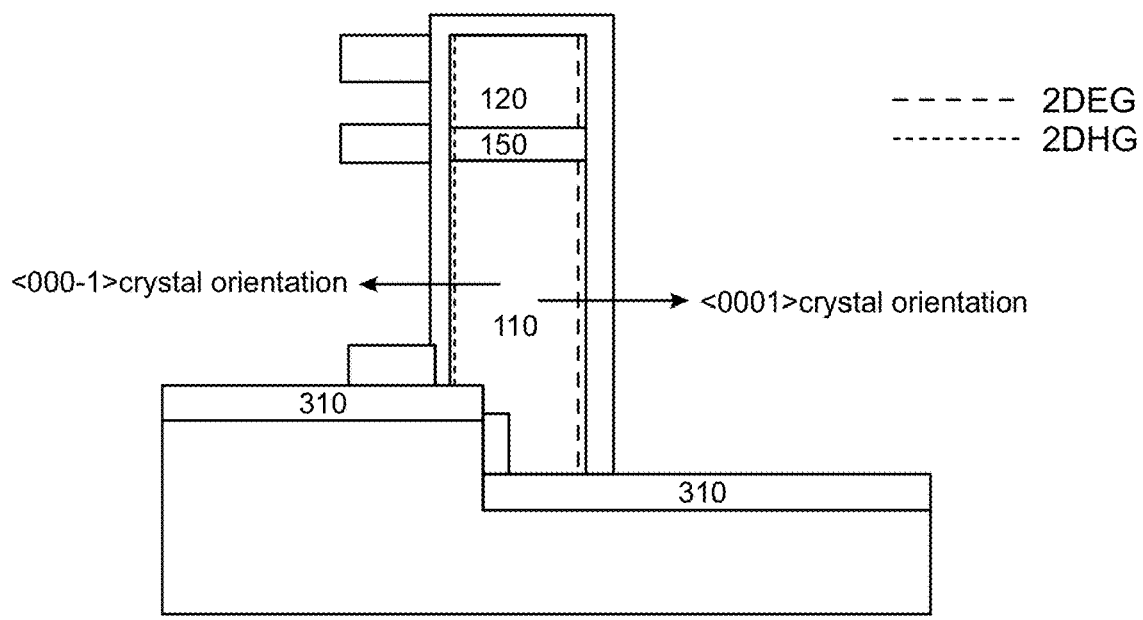
FIGS. 22-25 are schematic diagrams of an optional hole channel group III nitride transistor structure and a manufacturing method thereof.

Optionally, an insulating layer 310 as shown in FIG. 22 is formed on other surfaces of the substrate other than the vertical surface 1003. Optionally, the insulating layer covers all the other surfaces.

It should be indicated that when the substrate is an Si substrate, as the (111) surface and the (1⁻1⁻1) surface of the Si substrate have no difference in nature, the vertical surface 1003 of the substrate may be the (111) surface or the (1⁻1⁻1) surface of the Si substrate. The Si substrate may be an Si substrate employing (110) or (112) surface. Through the arrangement of the insulating layer, the melt-back effect of Ga atoms on the Si substrate during growth may be prevented. In addition, as the selective growth (selected area growth) of the nucleation layer, such as AlN, is very difficult, that is to say, amorphous or polycrystalline AlN is also easily generated on the insulating layer 400 in addition to that single crystal AlN is grown and formed on the vertical surface of silicon. The amorphous or polycrystalline AlN may have an adverse influence on the structure and function of the device, therefore, by etching an amorphous or polycrystalline portion, or introducing a Cl-containing corrosive gas such as $Cl_2$ or HCL gas during growth, and by utilizing an etching selection ratio of the gas to the single crystal AlN and the polycrystalline/amorphous AlN, the amorphous or polycrystalline AlN layer on the insulating layer 310 is removed, and the single crystal AlN layer on the vertical surface 1003 is retained. Since the nitride semiconductor containing a Ga material is difficult to nucleate and grow directly on the insulating layer, the nitride semiconductor may be only selectively grown on a single crystal AlN layer formed on the vertical surface.

It may be understood that as the polycrystalline or amorphous AlN layer is also an insulating layer in nature, a nitride semiconductor containing a Ga material is difficult to nucleate and grow on the polycrystalline or amorphous AlN layer, therefore, the polycrystalline or amorphous AlN layer on the insulating layer 310 may also be retained. Optionally, the polycrystalline or amorphous AlN layer may also be removed.

It may be understood that when the $Al_2O_3$ or SiC substrate is adopted, it is also possible that the above insulating layer is not required. This is mainly because the Ga atom is compatible with $Al_2O_3$ or SiC, and there is no melt-back phenomenon. The nitride semiconductor is easier to nucleate and grow on the vertical surface having hexagonal symmetrical lattice structure, so that the vertical surface naturally has the selective growth capability (capability of selected area growth).

It may be further understood that when the $Al_2O_3$ or SiC substrate is adopted, providing the insulating layer enables a process window of nucleation and growth on the vertical surface to be larger and more controllable. Therefore, when the $Al_2O_3$ or SiC substrate is adopted, an insulating layer 310 also may be formed on other surfaces other than the vertical surface 1003.

A method of forming an insulating layer 310 on the other surfaces other than the vertical surface 1003 is exemplified as follows.

Figure 23:
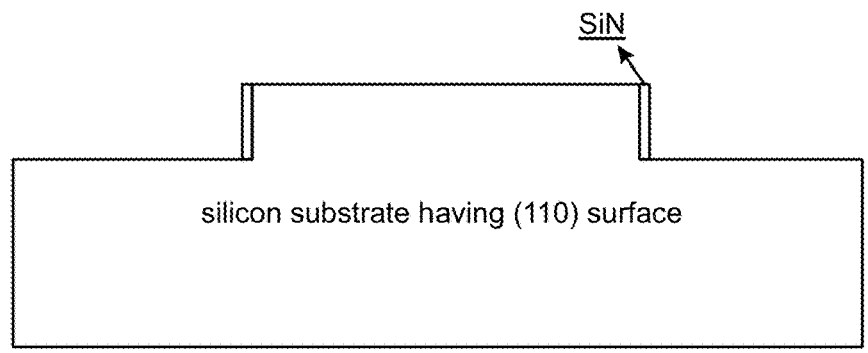
Figure 24:
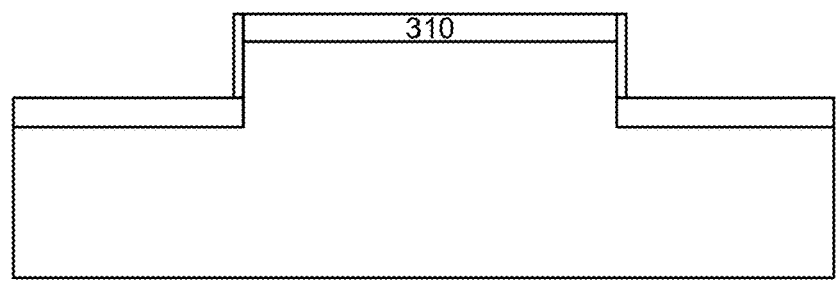
Figure 25:
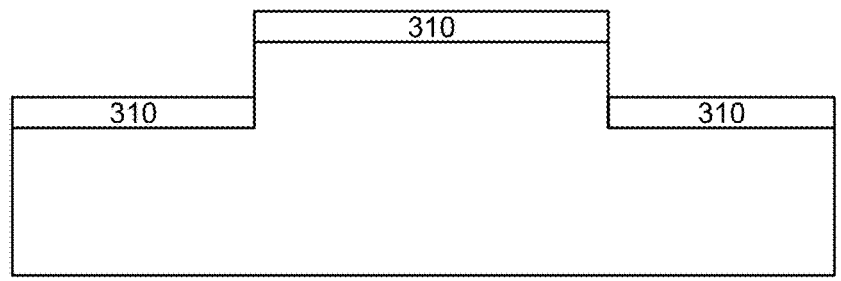
Figure 26:
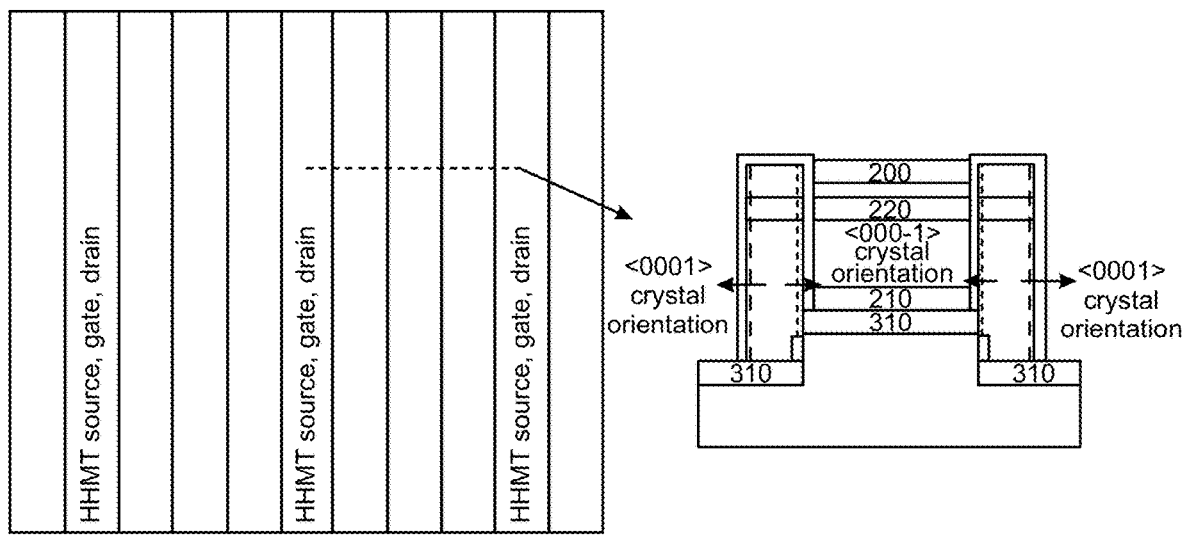
FIGS. 26-31 are schematic diagrams of an optional hole channel group III nitride transistor structure and a manufacturing method thereof.
Figure 27:
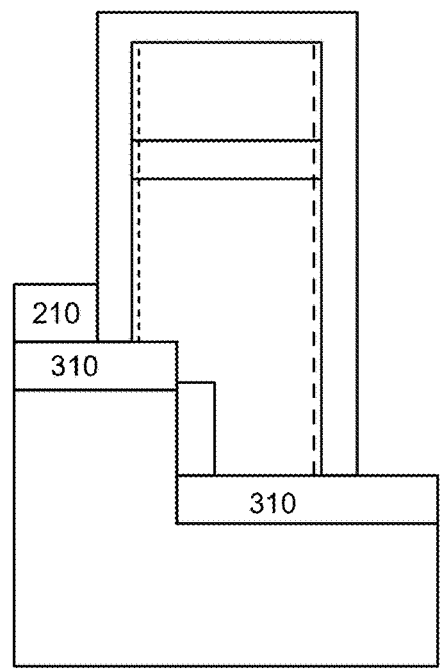
Figure 28:
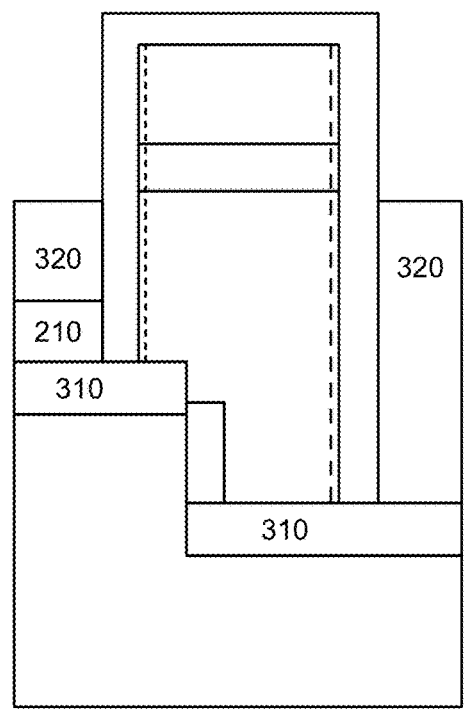
Figure 29:
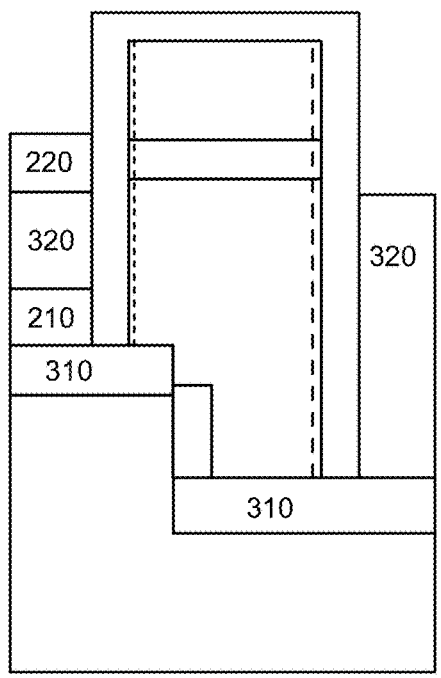
Figure 30:
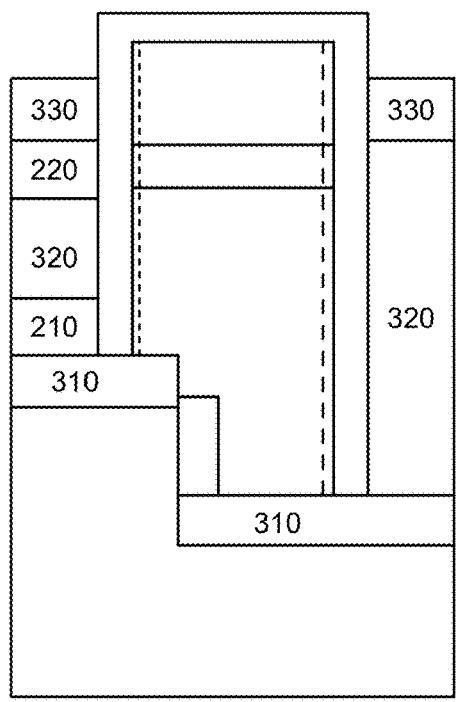
Figure 31:
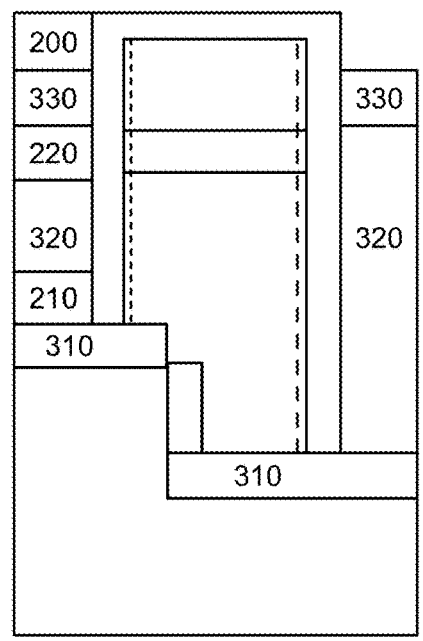

As shown in FIGS. 23-25, a boss shape is formed by etching the substrate, and the boss has two opposite vertical surfaces. Exemplarily, when the substrate is silicon, the vertical surfaces are (111) surfaces of silicon. SiN is then grown on the vertical surfaces through a technology such as LPCVD, and only SiN on side wall(s) is retained by an etching technology having a vertical orientation. Then, $SiO_2$ is grown by an oxidation process, and no $SiO_2$ is grown on the vertical surfaces as being protected by SiN, and an $SiO_2$ layer is formed on other surfaces of the silicon substrate. Subsequently, by using the etching selection ratio of SiN to $SiO_2$, SiN on the vertical surfaces is etched away by a wet etching process such as hot phosphoric acid etching, and the majority of silica on other surfaces is retained.

The design of the insulating layer can effectively avoid the influence of the substrate material on the performance of the device, which is helpful for increasing the withstand voltage and reducing the dark current.

Referring to FIGS. 26-31, a method of fabricating the source, the drain, and the gate is exemplified as follows.

After the HHMT transistor is formed, a thicker first metal layer 210 is formed on the first insulating layer formed on the first surface of the substrate by a method such as deposition and peeling or deposition and laser positioning etching. In addition to deposition on the first insulating layer, the first metal layer is also deposited in a small amount on the $(0001^-)$ surface of the barrier layer of the transistor, and then the metal layer on the $(0001^-)$ surface of the barrier layer of the transistor is removed by isotropic etching. Then, the second insulating layer 320 is formed by coplanar deposition on the first metal layer, and by means of CMP in combination with etching back or precisely controlling the growth thickness of the second insulating layer 320, the second insulating layer is of a height such that it is disposed at a gate region of the transistor and the barrier layer or the gate insulating layer at the gate region is exposed. Then, similar to the method of forming the first metal layer, a second metal layer 220 is formed on the second insulating layer, and likewise, in addition to deposition on the second insulating layer, the second metal layer is also deposited in a small amount on the $(0001^-)$ surface of the barrier layer of the transistor, and then the metal layer on the $(0001^-)$ surface of the barrier layer of the transistor is removed by isotropic corrosion. Then, the third insulating layer 330 continues to be formed by coplanar deposition on the second metal layer, and by means of etching back or precisely controlling the growth thickness of the third insulating layer, the third insulating layer is of a height such that it is disposed at the source region of the transistor, and the barrier layer or the second channel layer at the source region is exposed. Then, similarly, a third metal layer 200 is formed on the third insulating layer, and then the source electrode is formed by lithographic etching. Thus, as shown in the drawings, the gate, the source, and the drain are formed between two transistors at the same time.

It may be understood that the positions of the source and the drain may be exchanged with each other, and the source and the drain may form ohmic contact with the two-dimensional hole gas through a step such as annealing. The gate electrode forms Schottky contact with the barrier layer or is insulated and separated from the barrier layer by the gate dielectric.

As described above, the channel layer and the barrier layer of the group III nitride semiconductor are grown on the specific surface of the above substrate, for example, the GaN material or the AlGaN material, when the surface thereof is a (0001) surface or a (000-1) surface, both have gallium polarity or nitrogen polarity, that is, having <0001> or $<0001^->$ orientation. Thus, the 2DHG can be present in the channel layer near an interface between the channel layer and the barrier layer in the $<0001^->$ direction, and the 2DEG is present in the channel layer near an interface between the channel layer and the barrier layer in the <0001> direction.

Figure 32:
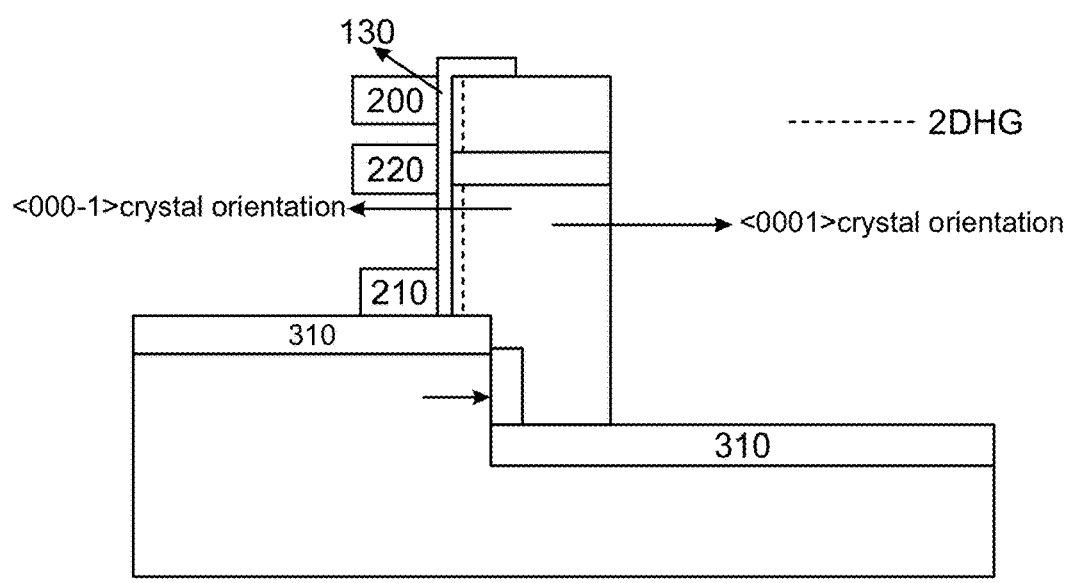

Optionally, as shown in FIG. 32, the barrier layer in the <0001> direction is removed, so that the two-dimensional electron gas 2DEG cannot be formed again in the <0001> direction. Alternatively, as shown in FIG. 33, a fourth insulating layer 340 is formed on the (0001) surface of the group III nitride semiconductor channel layer so as to protect the (0001) surface of the channel layer. It may be understood that the fourth insulating layer may extend onto a non-polar surface of the channel layer of the group III nitride semiconductor parallel to the first and second surfaces of the substrate.

The presence of the two-dimensional electron gas 2DEG will respond to changes in the potential of the source, the drain, and the gate, thus increasing the parasitic capacitance and the electricity leakage channel.

A radio frequency electronic device, for example, a personal computer, a mobile phone, a digital camera, and other electronic devices, including any one of the above transistors.

A power electronic device, wherein the power electronic device may be used in a power amplifier in the field such as mobile phone base station and optical communication system, or may be a power supply device, wherein the power electronic device may include any one of the above transistors.

The solution of the present disclosure at least can be helpful to realize one of the following effects: the hole channel group III nitride transistor structure can reduce the gate leakage current, has a high threshold voltage, high power, and high reliability, can achieve a low on-resistance and a normally-closed state of the device, and can provide a stable threshold voltage, such that the hole channel group III nitride transistor structure has good switching characteristics.

The solutions in the present disclosure can also contribute to achieve one of the following effects: higher channel density may be realized in unit area; the integration density of the transistor is improved; and the structure and preparation process of the transistor are simpler, and the production cost can be effectively reduced.

The present disclosure is described in the above in conjunction with the specific embodiments, but a person skilled in the art should understand that all of these descriptions are illustrative, rather than limitation on the scope of protection of the present disclosure. A person skilled in the art could make various modifications and changes to the present disclosure in accordance with the spirit and principle of the present disclosure, and these modifications and changes are also within the scope of the present disclosure.

INDUSTRIAL APPLICABILITY

The present disclosure provides a novel hole channel group III nitride transistor structure and a manufacturing method thereof. The hole channel group III nitride transistor is a normally-closed hole channel group III nitride transistor that is simple in process and low in cost, realizes higher channel density in unit area, has high performances such as high withstand voltage, high power, and low on-resistance, and saves energy.

The invention claimed is:

1. A method of manufacturing a non-planar hole channel semiconductor transistor, comprising:
   providing a substrate, etching an upper surface of the substrate to form a step-shaped structure, wherein the step-shaped structure has a first surface and a second surface substantially parallel to each other, and a vertical surface connected to the first surface and the second surface respectively, and lattices of the vertical surface have hexagonal symmetry;
   forming a nucleation layer on the vertical surface, wherein the nucleation layer is formed on a part of the vertical surface; or the nucleation layer is formed on the whole vertical surface;
   epitaxially growing a first channel layer laterally, with the nucleation layer as a core;
   continuing to epitaxially grow a second channel layer laterally, with the first channel layer as a core; and
   removing the second channel layer covering two sides of the first channel layer in a direction perpendicular to the vertical surface, to form a barrier layer on the first channel layer and the second channel layer, so as to simultaneously form a two-dimensional hole gas and immovable background negative charges and/or a two-dimensional electron gas and immovable background positive charges at an interface between the barrier layer and the first channel layer and between the barrier layer and the second channel layer.

2. The method according to claim 1, further comprising epitaxially growing an N-type buried layer laterally, with the first channel layer as a core; and
   continuing to epitaxially grow a second channel layer laterally, with the N-type buried layer as a core.

3. A non-planar hole channel semiconductor transistor, comprising:
   a substrate, formed with a step-shaped structure thereon, wherein the step-shaped structure has a first surface and a second surface substantially parallel to each other, and a vertical surface connected to the first surface and the second surface respectively, and lattices of the vertical surface have hexagonal symmetry;
   a non-planar channel layer, which is epitaxially grown laterally, perpendicularly to the second surface, and restricted by the second surface, with the vertical surface as a core, wherein the non-planar channel layer comprises a first channel layer and a second channel layer, the second channel layer is formed at one side of the first channel layer away from the second surface in a direction perpendicular to the second surface; and
   a barrier layer formed on the first channel layer and the second channel layer, so as to simultaneously form a two-dimensional hole gas and/or a two-dimensional electron gas at an interface between the barrier layer and the first channel layer and between the barrier layer and the second channel layer.

4. The non-planar hole channel semiconductor transistor according to claim 3, wherein a nucleation layer is provided on the vertical surface of the substrate.

* * * * *